United States Patent [19]
Tang

[11] Patent Number: 5,949,850
[45] Date of Patent: Sep. 7, 1999

[54] METHOD AND APPARATUS FOR MAKING LARGE AREA TWO-DIMENSIONAL GRIDS

[75] Inventor: Cha-Mei Tang, Potomac, Md.

[73] Assignee: Creatv MicroTech, Inc., Potomac, Md.

[21] Appl. No.: 08/879,258

[22] Filed: Jun. 19, 1997

[51] Int. Cl.[6] ..................................................... G21K 1/00
[52] U.S. Cl. ........................................... 378/154; 378/145
[58] Field of Search ................................... 378/154, 155, 378/145

[56] References Cited

PUBLICATIONS

E.W. Becker et al., "Fabrication of Microstructures with high aspect ratios and great structural heights by syncrotron Radiation Lithography, Galvanoforming, and Plastic Molding (LIGA Process)," *Microelectronics Engineering*, vol. 4 pp. 35–56 (1986).

Dr. P. Bley, "The Liga Process for Fabrication of Three–Dimensional Microscale Structures," *Interdisciplinary Sci. Rev.*, vol. 18, pp. 267–272 (1993).

"DARPA Awards Contract for X–Ray Lirthography System", *Micromachine Devices*, vol. 2, No. 3, p. 2 (1997).

R.L. Egan, "Intramammary Calcifications Without an Associated Mass", *Radiology*, vol. 137, pp. 1–7 (1980).

H. Guckel, program and notes describing his "Invited talk at the American Vacuum Society Symposium", Philadelphia, PA, Oct. 1996.

"IBM Team Develops Ultrathick Negative Resist for MEMs Users", *Micromachine Devices*, vol. 2, No. 3, p. 1 (1997).

"X–Ray Lithography Scanners for LIGA", *Micromachine Devices*, vol. 1, No. 2, p. 8 (1996).

E.P. Muntz et al., "On the Significance of Very Small Angle Scattered Radiation to Radiographic Imaging at Low Energies", *Med. Phys.* vol. 10, pp. 819–823 (1983).

M.J. Yaffe et al., "X–Ray Detectors for Digital Radiography", *Phys. Med. Biol.*, vol. 42, pp. 1–39 (1997).

H. Guckel, "NATO Advanced Research Workshop on the Ultimate Limits of Fabrication and Measurement", *Proceedings of the Royal Society (Invited Talk/Paper)*, pp. 1–15 (Apr. 1994).

H. Guckel et al., "Micromechanics via x–ray assisted processing", *Journal of Vaccuum Science Technology*, pp. 2559–2564 (Jul./Aug. 1994).

W. Ehrfeld, "Coming to Terms with the Past and the Future", *LIGA News*, pp. 1–3 (Jan. 1995).

H. Guckel et al., "Micro Electromagnetic Actuators Based on Deep X–Ray Lithography", *MIMR '95, Sendai, Japan*, (Sep. 27–29, 1995).

H. Guckel et al., "Micromechanics for actuators via deep x–ray lithography", *Proceedings of SPIE, Orlando, Florida*, pp. 39–47 (Apr. 1994).

Z. Jing et al., "Imaging characteristics of plastic scintillating fiber screens for mammography", *SPIE*, vol. 2708, pp. 633–644 (Feb. 1996).

N. Nakamori et al., "Computer simulation on scatter removing characteristics by grid", *SPIE* vol. 2708, pp. 617–625 (Feb. 1996).

(List continued on next page.)

*Primary Examiner*—Craig E. Church
*Attorney, Agent, or Firm*—Roylance, Abrams, Berdo & Goodman, LLP

[57] ABSTRACT

Methods for making large area grids consisting of focused and unfocused holes in sheets of metal. The grid consists of thin metal walls surrounding hollow openings. The projection of all walls converge to a focal spot in the focused grid, and on parallel or substantially parallel in an unfocused grid. A grid having a large area is made by interlocking together smaller grid pieces. A tall device is made by stacking layers of focused grids. Methods to make unfocused grids that detect parallel incoming x-rays are also described. The opening of the grid can be filled with phosphor or other scintillating materials to make a integrated grid/scintillator structure. These grids can also be applied to many applications such as x-ray antiscatter for diagnostic medical imaging, non-destructive testing, x-ray collimation, filters for liquids or electromagnetic radiation.

48 Claims, 26 Drawing Sheets

OTHER PUBLICATIONS

P. A. Tompkins et al., "Use of capillary optics as a beam intensifier for a Compton x–ray source", *Medical Physics,* vol. 21, No. 11, pp. 1777–1784 (Nov. 1994).

R. Fahrig et al., "Performance of glass fiber antiscatter devices at mammographic energies", *Am. Assoc. Phys, Med.,* vol. 21, No. 8, pp. 1277–1282 (Aug. 1994).

L.E. Antonuk et al., "Large Area, Flat–Panel, Amorphous Silicon Imagers", *SPIE* vol. 2432, pp. 216–227 (Jul. 1995).

H. E. Johns, OC, Ph.D., F.R.S.C., LL.D., D.Sc., F.C.C.P.M., *The Physics of Radiology,* Fourth Edition (Charles C. Thomas: Springfield, Illinois, 1983), p. 734.

Collimated Holes, Inc. products manual, pages entitled "Rectangular and Square Fibers/Fiber Arrays" (Apr. 1995) and "Scintillating Fiberoptic Faceplate Price List Type/LKH–6" (Dec. 1995).

H. Guckel, "LIGA and LIGA–Like Processing with High Energy Photons", *Microsystems Technologies,* vol. 2, No. 3, pp. 153–156 (Aug. 1996).

H. Guckel, "Deep X–Ray Lithography for Micromechanics and Precision Engineering", *Synchrotron Radiation Instrumentation (Invited), Advanced Photon Source Argonne,* pp. 1–8 (Oct. 1995).

METHOD AND APPARATUS FOR MAKING LARGE AREA TWO-DIMENSIONAL GRIDS

FIELD OF THE INVENTION

A method and corresponding apparatus for making large area focused and unfocused grids adaptable for use with, for example, x-ray imaging devices and the like. More particularly, the present invention relates to a method and apparatus for making large area grids comprising a plurality of layers which each include thin metal walls defining openings, and which can be stacked on top of each other to increase the overall thickness of the grid.

DESCRIPTION OF THE RELATED ART

Large area grids consisting of focused and unfocused holes in sheets of metal have many applications. For example, the grids can be used as anti-scatter grids in systems which emit electromagnetic energy, such as x-ray systems and ultra-violet systems. The grids can also be used as collimators, x-ray masks and so on. The present invention provides methods and apparatuses for fabricating and assembling the grids.

X-ray Anti-scatter Grid for X-ray Imaging

Systems for forming x-rays images are used in a variety of applications, such as in medical diagnostics, non-destructive testing, air-port security, x-ray astronomy, and a variety of scientific and research applications.

Conventional x-ray imaging systems comprise of a point x-ray source and a image recording device. The object to be imaged is placed in between the x-ray source and the detector. The images are produced by a local reduction in the intensity of the primary x-rays produced by the x-ray source reaching an imager or photographic film as caused by the internal structure of the object being imaged which has been placed in their path. These local intensity reductions correspond to the distribution of absorption (attenuation) in the object under study. The specific amount of attenuation by the object depends, for example, on its thickness, its chemical composition, and the x-ray energy. Such an imaging modality is effective when the interesting components of the object are either more strongly absorbing, or more weakly absorbing, than the background environment.

Thus, x-rays can be used in medical applications to differentiate healthy tissue, diseased tissue, bone, and organs from each other. An anti-scatter grid can be applied to most diagnostic x-ray imaging modality. For the description below, mammography is used as an example.

As x-rays interact with tissue, x-rays become attenuated as well as scattered by the tissue. Without intervention, both the scattered and primary radiations from the patient are recorded in a radiographic image. Subject contrast and the signal-to-noise ratio of details in the image are reduced. For mammography, the typical a scatter-to-primary ratios (S/P) at the image recorder range from 0.3 to 1.0. The presence of the scatter can cause up to a 50% reduction in contrast, and up to a 55% reduction (for constant total light output from the screen) in signal-to-noise ratio as described in an article by R. Fahrig, J. Mainprize, N. Robert, A. Rogers and MJ Yaffe entitled, "Performance of Glass Fiber Antiscatter Devices at Mammographic Energies", Med. Phys. 21, 1277 (1994).

The measured peak angle of scatter is about 3° to about 8° for water, lucite and polyethylene (see, e.g., an article by E. P. Muntz, T. Fewell, R. Jennings, and H. Bernstein entitled, "On the Significance of Very Small Angle Scattered Radiation to Radiographic Imaging at Low Energies", Med. Phys. 10, 819 (1983)) and is 6° for a breast phantom (for a 30 cm×33 cm block of breast equivalent material, 5 cm thick). Without the anti-scattering grid, the scatter blurs the image, reducing contrast between the healthy tissue and the cancerous tissue. Only the x-rays propagating in the line from the x-ray source to the detector are needed to product a sharp image. Hence, an anti-scattering grid is used to reduce or eliminate the scattered rays.

However, the presence of the grid, while reducing scattered radiation, also leads to considerable attenuation of primary radiation. As a result, for film recording, a higher dose is required to maintain the optical density of the film at its optimum operating point, to compensate for the loss of this primary radiation as well as the rejected scattered radiation. The increase in dose is related to the Bucky factor (ratio of the entrance exposure required with the grid to that required without the grid) and is generally in the range of a factor of 2 (thin breasts) to 3 (thick breasts) for currently available one-dimensional mammographic grids. Even ideal grids that transmit all of the primary radiation and none of the scattered radiation would have a Bucky factor of between 1.3 and 2, depending on the thickness of the breast, as described in the Fahrig et al article cited above.

The most common anti-scatter grids are one-dimensional arrays of lead lamella, sandwiched between more x-ray transparent spacer materials such as aluminum, carbon fiber or wood (see, e.g., the Fahrig et al article). This type of grid reduces scattered radiation and hence improves the contrast in the image by reducing scatter in one direction. The typical grid ratio (height of grid wall: interspace length) is 4:1 or 5:1. The disadvantages associated with this type of one-dimensional grid are the inability to reduce scatter in one direction, the additional increase in x-ray dose required due to the presence of the spacer materials and scatter caused by the spacer materials. For slot scan imaging systems, a focused one-dimensional grid will be sufficient, because the primary image x-ray is a sheet beam.

For most applications, however, the image x-ray source produces a cone beam. For these types of applications, it is important to eliminate scatter from all directions. The grid wall needs to be two-dimensional, not strips, so that it can transmit the primary radiation, and also block scattered x-rays from all directions. Recently, the Lorad Division of Trex Medical of Danbury, Conn. introduced in the market a two-dimensional HTC grid.

As also discussed in the Fahrig et al article, the ratio of scattered to primary radiation (S/P) value for the two-dimensional, fiber-optic grids is 3 to 78 times lower than the S/P ratio measured with a one-dimensional grid at mammographic energies. The improved reduction would result in higher image contrast.

X-ray sources for laboratory imaging are point sources. The sources are located at a relative close proximity to the film or detector. Thus, the x-rays spreads out like a cone, reaching the film or detector at angles dependent on the positions. In order to maximize the transmission of the primary radiation, all the grid openings have to point to the x-ray source. This kind of grid geometry is called a focused grid.

For medical diagnostics, it is important to have focused, two-dimensional grids. Many fabrication methods are in development, such as those for producing grids made of hollow glass fibers, hollow plastic fibers, micro-channel plates, and so on. However, all of these methods have difficulties in making a flat, focused, two-dimensional grids with precision in a large area.

Not all x-ray imaging applications require focused grids. For example, the desirable x-rays for x-ray astronomy is from sources far away and they approach the detector as parallel rays. Anti-scatter grids are required to eliminate x-rays from different sources at different location in the sky. Thus, the walls of the grid should be parallel so that only x-ray from a very narrow angle can be detected. The grids with parallel walls are known as an unfocused grid.

Also, there are variations of focused and unfocused grids, such as a) grids focused in one direction, but unfocused in the other direction; b) grids that are piecewise focused, and so on.

Other factors also need to be considered depending on the application in which the grid is to be used.

For example, in film recording, an important consideration is the percentage of the primary radiation that is transmitted by the grid, i.e., the percentage of the open area versus the sum of open and grid wall area. For the film application, a decrease of this percentage increases the Bucky factor and increases the necessary dose to the patient. For device point of view, the grid wall should be as thin as possible for application to film recording.

For digital recording, the grid opening percentage should be larger than the fill-factor, defined as the charge collection area of a pixel over the whole pixel area. The fill-factors of the flat-panel digital x-ray detectors currently are not very high. For example, the fill-factors are 0.62 for 450 $\mu$m pixel pitch, and 0.35 for 127 $\mu$m pixel pitch, as described in an article by L. E. Antonuk et al, entitled "Large Area, Flat-Panel, Amorphous Silicon Imagers", SPIE Vol. 2432, 216 (1995).

For digital recording, an additional consideration is that grid walls should not be covering the pixel area which is responsible for charge collection. When the grid walls overlap the charge collection area, the percentage of the primary radiation could be detected is further reduced, leading to an increase of Bucky factor and the need of higher dose to the patient. For digital detectors utilizing phosphors and P-I-N photo-diodes, the grid walls should not cover any part of the photo-diode. For digital detectors utilizing direct x-ray to charge conversion, the grid walls should not be covering the charge collection electrode.

In order to accomplish this, the grid geometry has to be able to match the detector pixel shape accurately and reproducibly.

Since the peak angle of the scattered radiation ranges from about 3° to about 8°, the walls of the grid have to be sufficiently high to eliminate the scatter. This requires very high aspect ratio for the wall height versus wall thickness. For example, with a 150 micron pitch and 20 micron thick walls, the walls have to be 2,500 microns tall to eliminate radiation from angle larger than 3°. The yield of thin and high grid walls based on electroplating are too low to be practical, because it is difficult to provide uniform electroplating rates in very high aspect ratio trenches.

For most medical imaging applications, the size of the grid are large. For mammography, the x-ray images are to be collected from a 40 cm×40 cm area. The image sizes for lung is even bigger. These sizes are too large to be made in one piece, mainly due to the limitation of the yield as described above.

Accordingly, a continuing need exists for an improved method and apparatus for making large focused and unfocused grids for use in the applications described above.

SUMMARY OF THE INVENTION

An object of the present invention, therefore, is to provide a method and apparatus for making large focused and unfocused grids that can be used, for example, with x-ray imaging systems and the like. This and other objects of the present invention are achieved by providing a method for making a grid comprising a plurality of interlocking pieces. That is, the grid is made by a lithographic process to produce the plurality of pieces. The plurality of pieces are then mated together to form a grid. The grid includes a plurality of holes such that several grids can be stacked on top of each other with these holes aligned. A metal pin or the like can be inserted into other aligning holes in each of the grids to thus secure the stacked grids together to form a thick grid in which each of the thin grids constitute a layer of the thick grid.

Also, the holes and the walls are parallel or focused to a point. Thus, the fabrication method and apparatus according to the present invention can be used to make focused, piecewise focused, or unfocused two-dimensional grids, or variations thereof. Since the proposed grid is produced by lithographic method, it can be fabricated to precisely match the pixel sizes and shapes of the flat-panel digital detectors. The ability to reproduce the grid exactly is very useful for integrating with x-ray detectors. Of course, the shape of the holes can be varied depending on the application in which the grid is used.

Also, the height of each layer can be produced with an accuracy of ±1 $\mu$m. Thus, by stacking, the height of the grid is unrestricted. The walls of the metal sheet can be made with any variety of materials that can be electroplated.

Since smaller pieces of grids can be made accurately, the method of making a large piece is by designing the grid in patterns like a jigsaw puzzle and assembling the smaller pieces into a large piece.

Accordingly, the grid fabrication method described here is ideal for digital detector applications. The proposed grid geometry is laid out lithographically and can be made reproducible like the detector. The openings of the grid can be aligned to the photo-diode of the digital detector, and the walls of the grid become unnoticeable.

Depending on the application, the grid opening shape can vary from squares to any desirable design or pattern. For example, if the grid is being used as an anti-scatter grid in x-ray medical imaging, the top view of the preferred shape of the holes in the grid is a plurality of square shaped holes arranged in regular pattern.

For medical imaging applications, the grid should be flat, so that it matches the flatness of the film or the detector. In principle, it is also possible to make grid surfaces in other than flat sheets, by applying polymethylmethacrylate (PMMA) or photoresist over cylindrical surfaces.

In addition, the holes of one or more layers of the anti-scatter grid produced by the present invention can be filled with various materials such as phosphor or the like. Since the grids can be reproduced exactly, air-core grids with phosphor cores and align them accurately. Grids not produced by lithographic methods will have difficulty aligning the two layers. Misalignment of the two layers would significantly decrease the primary signal. Variations in the height of the layers can also be made. Thus, the thickness of the phosphor can also be obtained precisely, and the grid will act as an anti-scatter grid/scintillator. This anti-scatter grid/scintillator therefore performs the functions of (1) eliminating detection of scattered x-rays, (2) conversion of x-ray to light and (3) improving resolution by eliminating cross talk introduced by the light generated by the phosphor. The integrated collimator/scintillator can be aligned and bounded to the large area x-ray detector.

Accordingly, the method and apparatus makes it possible to manufacture a two-dimensional grid which can be flat and a focused or unfocused grid. The grid can also be made to conform to a curved surface. The openings in the grid can be air-core or filled with low atomic number adhesive or other materials. Also, the patterns and dimensions of the grids can be designed and made to match the pixel dimensions of flat-panel digital x-ray detectors. The grid wall thickness may be as thin as 10 µm, and thicker walls are even easier to make. There is no inherent limitation on grid ratio (grid height: inter-space length), and the grids are reproducible with precision.

Furthermore, the grid can be filled with phosphor to make anti-scatter grid/scintillator assembly. Also, digital detectors typically lose a percentage of the x-rays due to fill-factor. The introduction of properly designed and aligned grid, as made in accordance with the present invention, will not result in additional loss of any primary radiation per pixel in a digital detector caused by the presence of the grid.

BRIEF DESCRIPTION OF THE DRAWINGS

These and other features and advantages of the present invention will be more readily apprehended from the following detailed description when read in connection with the appended drawings, in which.

DETAILED DESCRIPTION OF THE PREFERRED EMBODIMENTS

Figure 1:
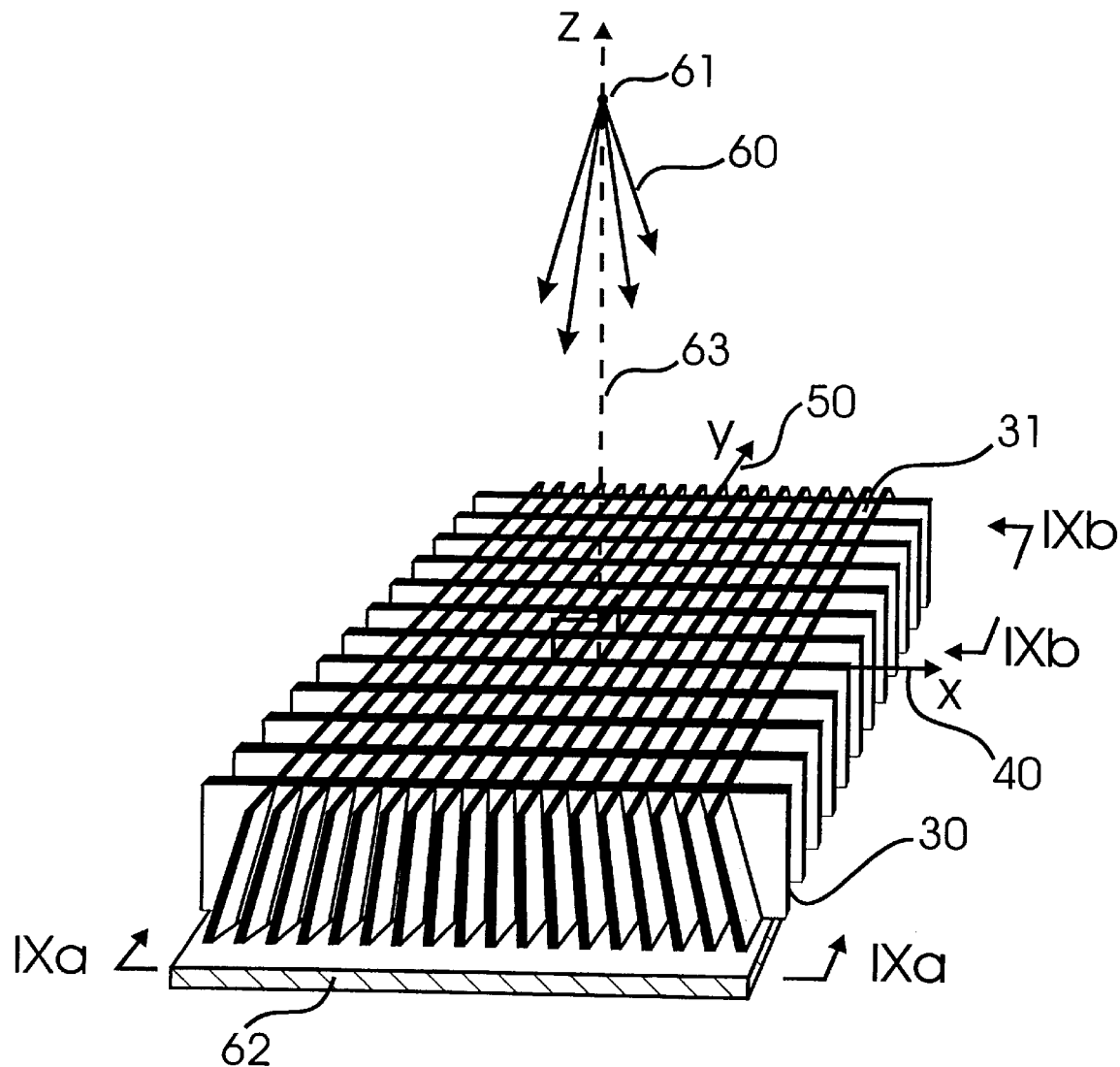
FIG. 1 is a schematic of a perspective view of a section of a two-dimensional anti-scatter grid made by a method according to an embodiment of the present invention.

The present invention provides a method and apparatus for making large area, two-dimensional, high aspect ratio, focused or unfocused x-ray anti-scattered grids, anti-scatter grid/scintallators, x-ray filters and the like. Referring now to the drawings, FIG. 1 shows a schematic of a section of an example of a two-dimensional anti-scatter grid 30 produced in accordance with an embodiment of a method of the present invention.

As shown, the x-ray propagates out of a point source 61 in a cone shape 60. The object to be imaged (not shown) is position between the x-ray source and the x-ray grid 30. The x-ray imager 62 which is, for example, a digital detector or x-ray film, is placed adjacent and parallel or substantially parallel to the x-ray grid 32 with the x-ray grid between the x-ray source 61 and the x-ray imager. Typically, the x-ray grid 30 is perpendicular or substantially perpendicular to the line 63 that extends between the x-ray source and the x-ray grid 30.

To facilitate the description below, a coordinate system in which the grid 30 is disposed will now be defined. The z-axis is the line 63 that is perpendicular or substantially perpendicular to the anti-scatter grid and intercepts the point x-ray source 61. The z=0 coordinate is defined as the top surface of the anti-scatter grid. Line 40 is the x-coordinate, and line 50 is the y-coordinate.

The grid openings 31 which are defined by walls 32 are square in this example. However, the grid openings can be any practical shape as would be appreciated by one skilled in the art. The walls 32 are uniformly thick or substantially uniformly thick around each opening in this figure, but can vary in thickness as desired. The walls 32 are slanted at the angle that allows the x-rays from the point source to propagate through the holes to the imager without significant loss. That is, the directions in which the walls extend converge or substantially converge at the point source 61 of the x-ray. The angle at which each wall is slanted in the z direction is different from its adjacent wall as taken along the directions x and y.

The desirable dimensions of the x-ray grids depend on the application in which the grid is used. For typical medical imaging applications, the area of the top view is large and the height of the grid is very thin. The variation in area and thickness depends on the x-ray energy, resolution, image size and the angle of the typical scattered radiation.

For mammographic imaging, for example, the x-ray energy is in the range of about 17 kVp to about 35 kVp, but can be any level as would be necessary to form a suitable image. The distance between the x-ray source and the grid plane is usually in the range of 50 to 100 cm but, of course, could be any practical distance as would be appreciated by one skilled in the art. The measured peak angle of scatter θ is about 3° to about 8° for water, lucite and polyethylene (see, for example, the Muntz et al article discussed above) and is about 6° for a breast phantom (for a 30 cm×33 cm block of breast equivalent material, 5 cm thick) (see the Fahrig et al article discussed above). Without the anti-scattering grid, the scatter blurs image reducing contrast between healthy tissue and cancerous tissue. Only the x-rays propagating in the line from the x-ray source to the detector are desired to produce a sharp image.

For mammographic imaging, the dimensions of the grid is determined in the following manner.

The field size is determined by the object to be imaged. A field size up to about 40 cm by about 40 cm is desirable, but any suitable field size can be used. The field size depends on the imaging system in use and the medical procedure. For example, some procedures require only images over small areas as small as few cm$^2$.

The wall height is determined by the angle θ of the scatter that the grid 30 tries to eliminate. The height has to be longer than l/tan θ, where l is dimension of the hole. To eliminate scatter from angles θ larger than 4° or about 4° with hole dimensions of 80 μm or about 80 μm, wall height has to be at least 1,145 μm tall. Wall height of hundreds of μm to two or three thousands of μm are typical for a hole opening of this size.

The wall thickness is determined by the x-ray energy and the material for the wall. The linear attenuation coefficients μ of copper (atomic number Z=29) is μ=303 cm$^{-1}$ at 20 keV, as described in a book by H. E. Johns and J. R. Cunningham, *The Physics of Radiology*, Charles C. Thomas Publisher, Springfield, Ill., 1983. This means that the intensity of the x-rays decay by a factor of e in a distance of δ=1/μ=33 μm and the scattered rays hit the grid walls with a small angle will be absorbed. Hence, a wall thickness of 10 microns or about 10 microns is more than sufficient to eliminate the scattered x-rays in the 3°–8° range, and a wall thickness of within the range of about 5 to about 20 μm are typical.

The hole dimensions are to be determined by considerations such as the percentage of open area and the method of x-ray detection. The ratio R of the open area is determined by R=(open area)/(open area+wall area). The percentage of open area should be as large as possible for film applications and some digital imaging applications. For dimension l=80 μm, and wall thickness of 20 μm, the percentage of the open area is at or about R=64%. For a dimension at or about l=90 μm, and wall thickness of at or about 10 μm, the percentage of the open area is at or about R=81%. The hole dimension of or about 50 μm to few hundred of μm are typical. For mammographic applications, the percentage of the ratio of the open area R should be as close to 100% as possible.

In typical application, the anti-scatter grid moves in the x-y plane in patterns that will not result in non-uniform intensity caused by the shadow of the grid walls. When the anti-scatter x-ray grid can be precisely fabricated and aligned with a large area, digital detector, movement of the anti-scatter grid is not necessary. The ideal open area 31 of the anti-scatter grid should be larger than and completely overlap the sensing area of the a pixels of the digital detector.

For other medical x-ray imaging applications, the x-ray imaging systems are different for different parts of the body. Some applications are used for taking chest, heart and brain x-rays, for example. To produce three-dimensional images, a CAT scan has detectors surround the body, but each tile of the detector is small in size. The x-ray anti-scatter grid has to match the film sizes or the detector sizes for these applications.

Anti-scatter grids for medical applications thus cover a wide range of sizes. The grid thickness can be from at or about 5 μm to any desirable thickness. The lower limit of the hole dimension is on the order of or about one μm and the upper limit is the size of substrates. However, there are rough relationships between wall thickness and hole sizes with the layer thickness. When the device has 80 μm holes and 20 μm thick walls, the layer height of 200 μm is feasible with nickel. As the hole size or wall thickness decreases, the layer height will have to be reduced. One reason is that it is difficult to electroplate thin walls with a high aspect ratio without defects. However, a tall device can still be constructed by stacking thinner layers that can be fabricated to the desired total device height.

As stated, the wall thickness can varied depending on the application in which the grid is used, and the walls do not have to have uniform thickness. Also, the shape of the hole can be varied as long as it does not result in having the walls having in extended sections that are thinner than about 5 μm. Also, the shapes of the holes do not have to be regular. Some hole shapes that may be practical for anti-scatter applications are rectangular, hexagonal, circular and so on.

The walls can be made of any material that can be used as an electroplating material. Materials with high atomic number Z are desirable. For instance, the walls can include nickel, nickel-iron, copper, silver, gold and any other common electroplating materials.

A method according to the present invention for forming a grid such as that shown in FIG. 1 will now be described.

Figure 2:
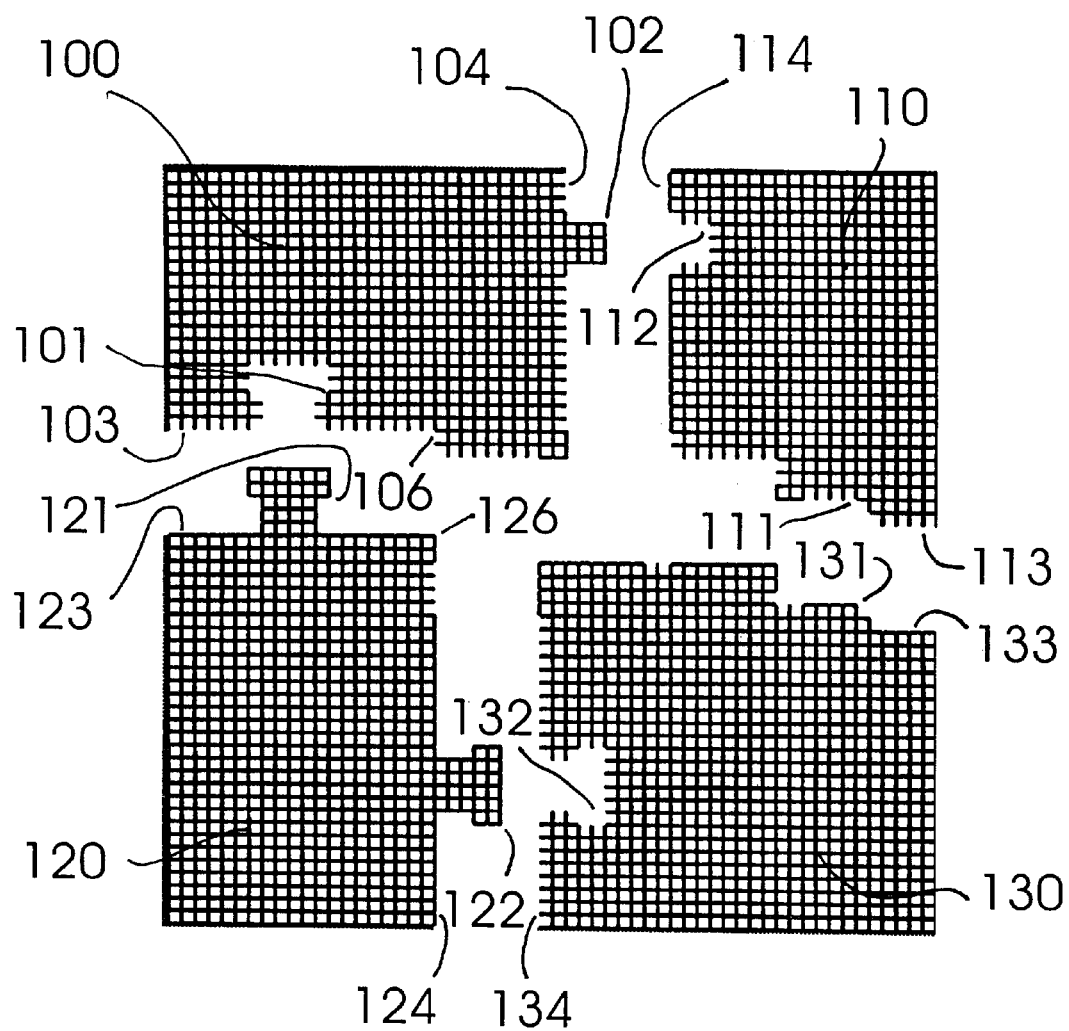
FIG. 2 is a schematic of a top view of interlocking portions of an anti-scatter grid that are coupled together to form a large area two-dimensional anti-scatter grid as shown in FIG. 1.

FIG. 2 shows a schematic of a top view of four pieces 100, 110, 120 and 130 of two-dimensional anti-scatter grid, such as grid 30 shown in FIG. 1, that can be fitted together to form a square-shaped grid. The four pieces can be assembled by placing (a) corner 101 next to corner 121, (b) corner 102 next to corner 112, (c) corner 111 next to corner 131, (d) corner 132 next to corner 122, (e) spoke 104 against recess 114, (f) spoke 113 against recess 133, (g) spoke 134 against recess 124 and (h) spoke 103 against 123. Hence, a large sheet constituting the grid can be constructed with many smaller pieces like a jigsaw puzzle. The possible shapes of the pieces can be varied as with jigsaw puzzle pieces, and naturally, the number of pieces need not be four, but can be any practical number depending on the size of the sheet to be constructed.

Figure 3:
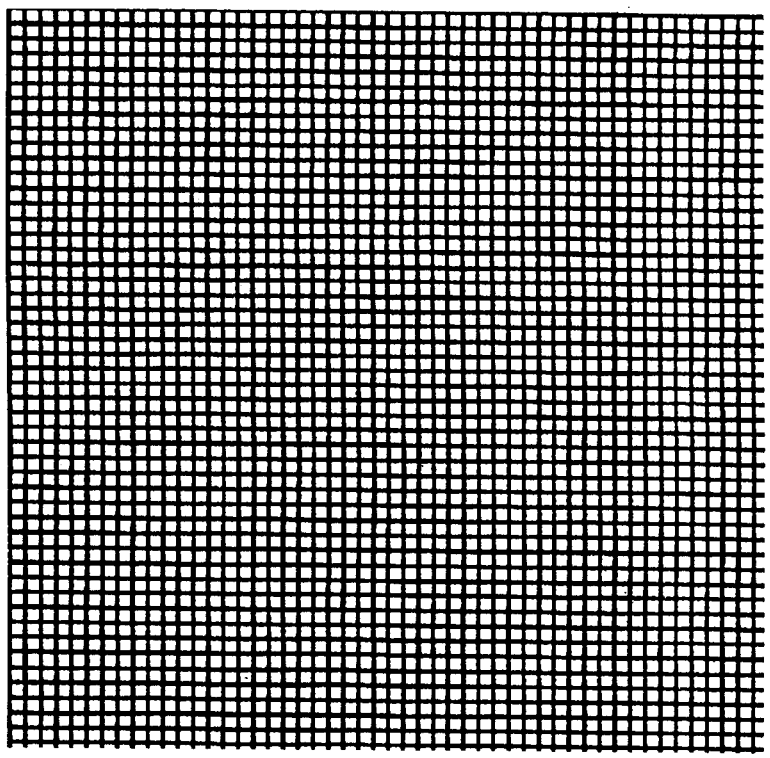
FIG. 3 shows a top view of the four pieces shown in FIG. 2 after being assembled together.
Figure 4:
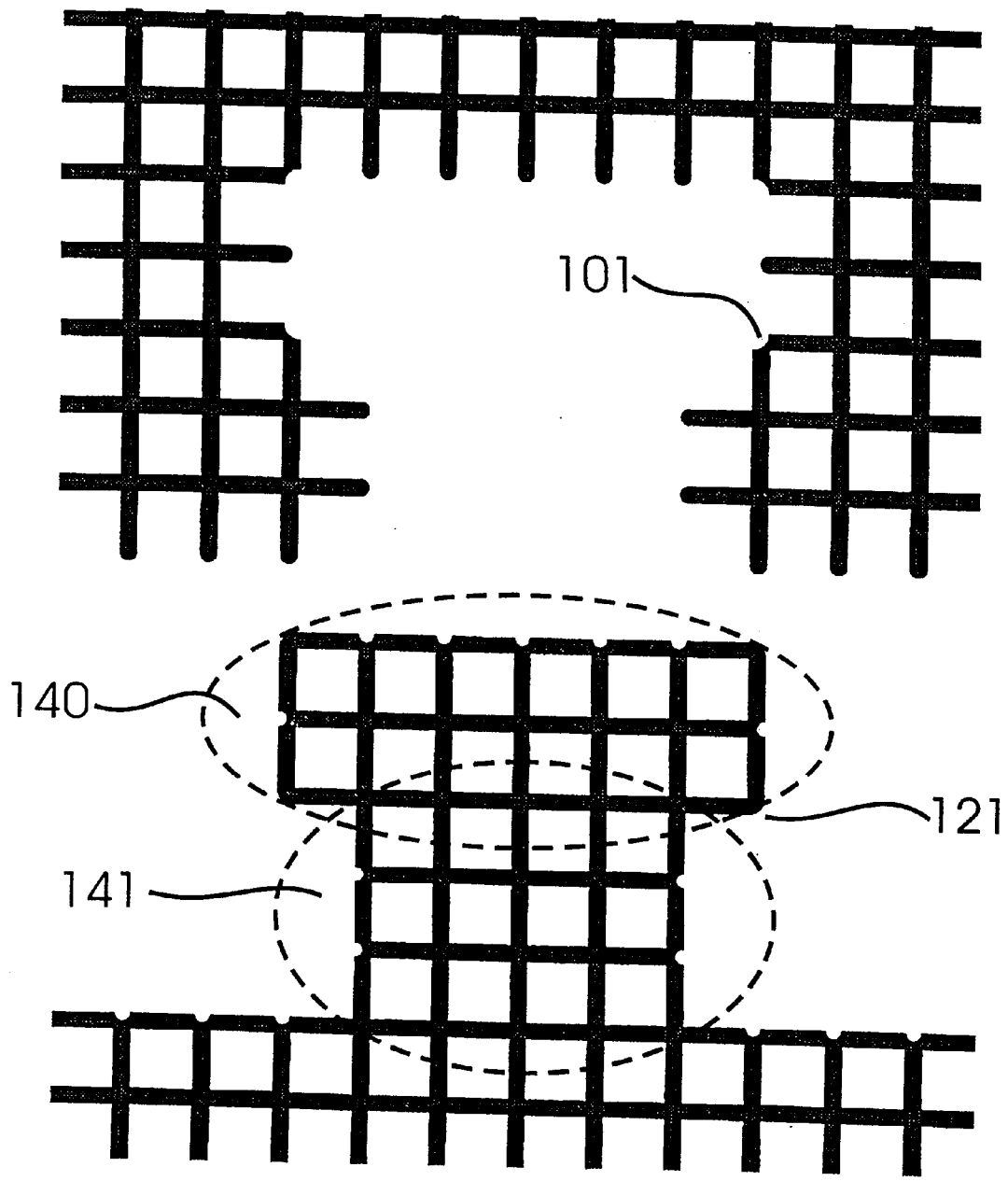
FIG. 4 shows an enlarged view of mating portions of the pieces shown in FIG. 2.

FIG. 3 shows the schematic of the four pieces 100, 110, 120 and 130 assembled to form a grid like grid 30. FIG. 4 shows a close up of, for example, a key and mate configuration of the pieces. In order to produce a good key and mate that prevents it from coming lose, the head encircled by the dashed curve 140 should be bigger than the neck 141. The type of key and mate shown in FIG. 4 is preferable over the key and mate of 102 with 112 or key and mate of 113 with 133, but, of course, any configuration can be used.

Figure 5:
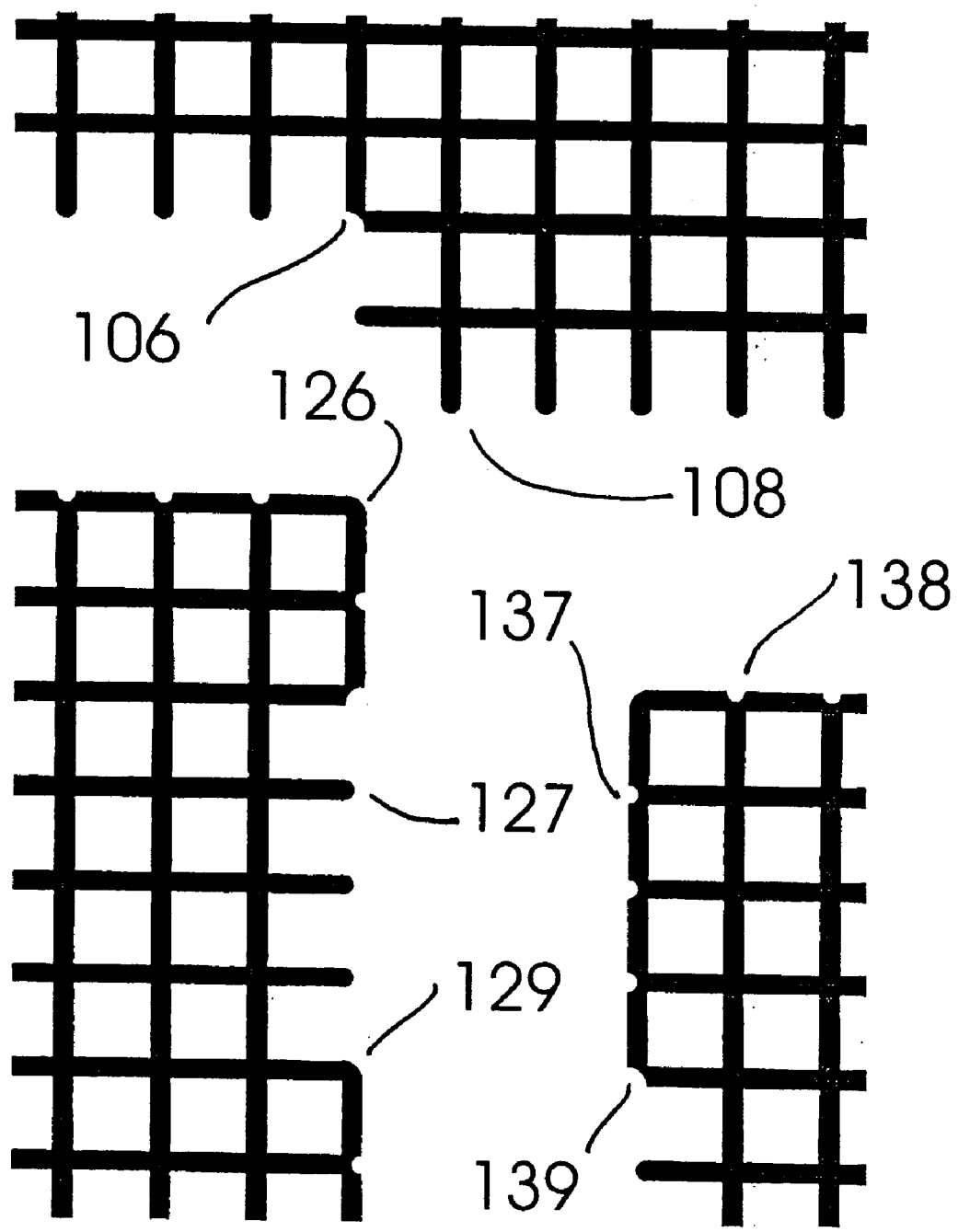
FIG. 5 shows an enlarged view of mating portions of the pieces shown in FIG. 2 being assembled as a three piece corner joint.

FIG. 5 shows a possible three piece corner at which pieces 100, 120 and 130 mate. The corner 126 fits into recess 106; the corner 137 fits into recess 127; the corner 129 fits into recess 139 and the spoke 108 fits into slot 138.

Figure 6:
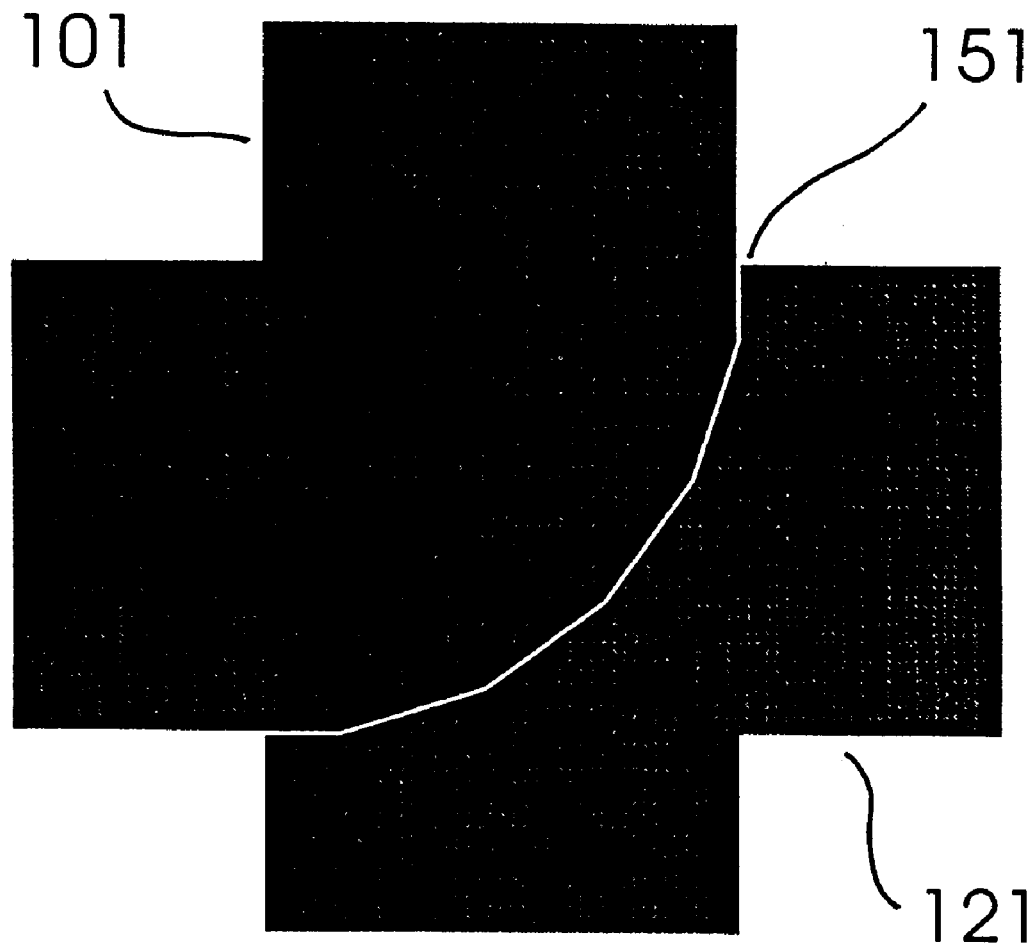
FIG. 6 shows an enlarged view of the corner joint shown in FIG. 5 after assembly.

FIG. 6 shows a close up view of an example of the joint formed by corner 101 and corner 121 after assembly. The gap 151 is 0.5 $\mu$m or about 0.5 $\mu$m. Actually, the shape of the mating portions are arbitrary as long as they securely interlock so the corner can not move or bend. The dimension of gap is preferably 0.5 $\mu$m wide, but wider gaps are also acceptable.

Figure 7:
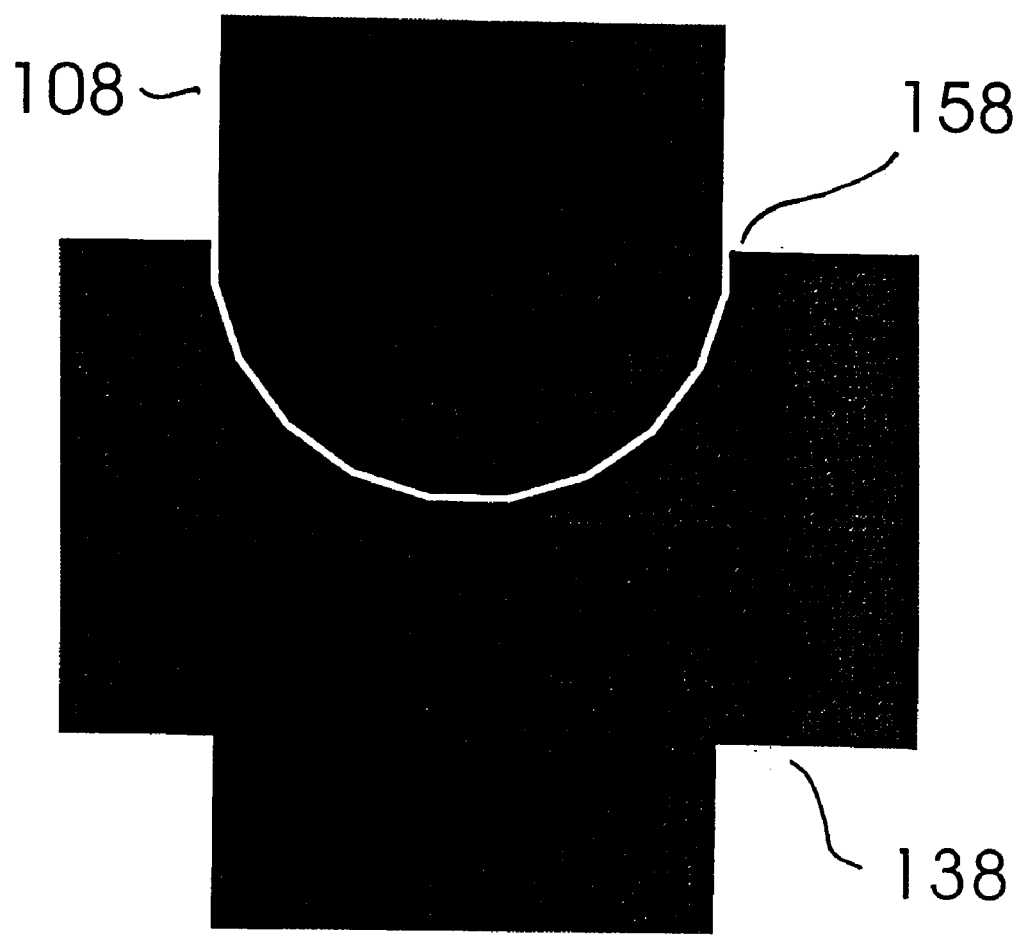
FIG. 7 shows an enlarged view of a different joint of the pieces shown in FIG. 2 after assembly.

FIG. 7 shows a close up view of the joint formed by spoke 108 and recess 138 after assembly. The gap 158 is 0.5 $\mu$m or about 0.5 $\mu$m. Actually, the shapes of the mating portions are arbitrary as long as they securely interlock that the spoke 108 will not slip out of the recess 138.

There also exist many x-ray applications in which the grid according to the present invention can be used other than medical imaging. An example is given here:

For some applications, x-rays patterns of specific shape and at a specific location must be selected from a large area that is illuminated by the x-ray source.

Figure 8:
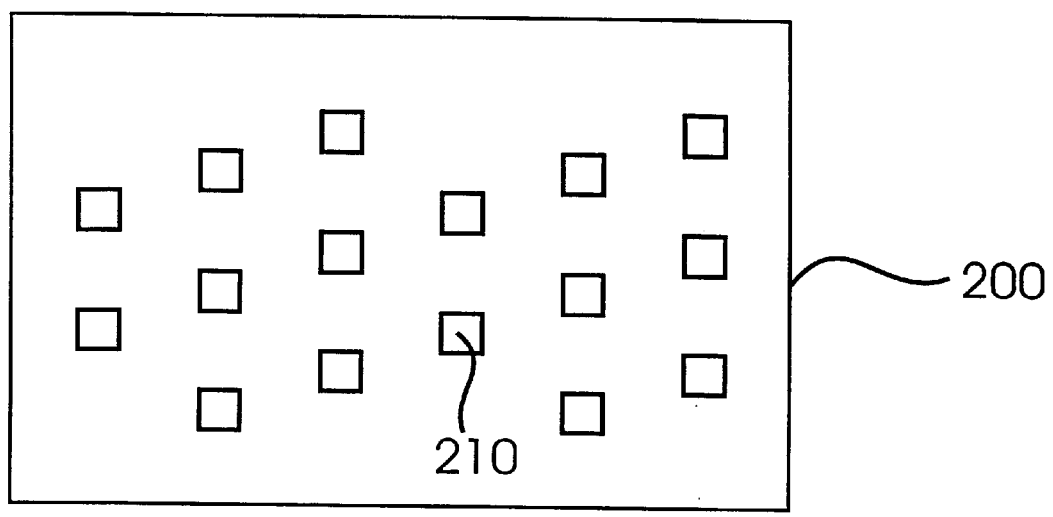
FIG. 8 is a schematic of a top view of an embodiment of an x-ray filter made in accordance with the present invention.

Specifically, FIG. 8 illustrates a schematic of an x-ray anti-scatter/filter 200 having a pattern of openings designated as squares 210 arranged as shown. X-rays propagating onto the filter at locations outside the squares 210 are blocked by the grid. In this application, the percentage of the surface area occupied by the holes are small compared to the surface area of the filter. The shape of the holes 210 do not have to be square but can be any shape, such as rectangular, circular, octagonal, and so on, as desired. Also, the holes can be regularly spaced or have no particularly uniform pattern. The holes can also be focused or unfocused, as are the openings in the grid 30 shown in FIG. 1 as described above. The x-ray anti-scattered filler 200 can be fabricated in accordance with the methods for fabricating a grid as discussed below.

Figure 9A:
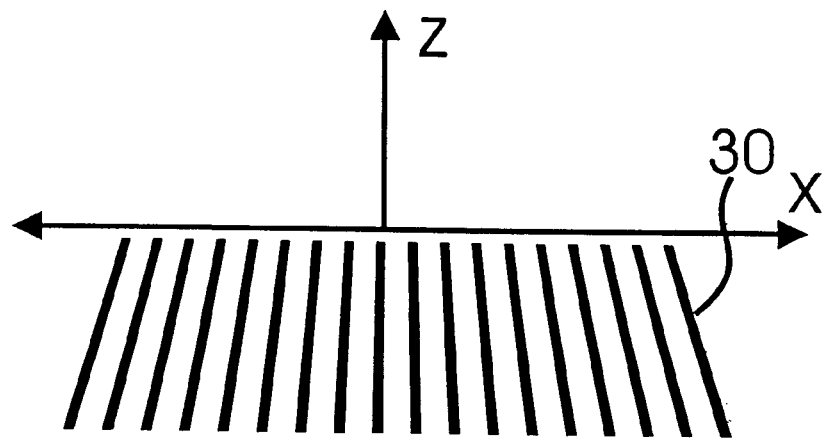
FIGS. 9a and 9b are schematics of examples of side views as viewed in the x-z and x-y planes along lines IXa—IXa and IXb—IXb, respectively, in FIG. 1 of a single layer of a focused anti-scattered grid.
Figure 9B:
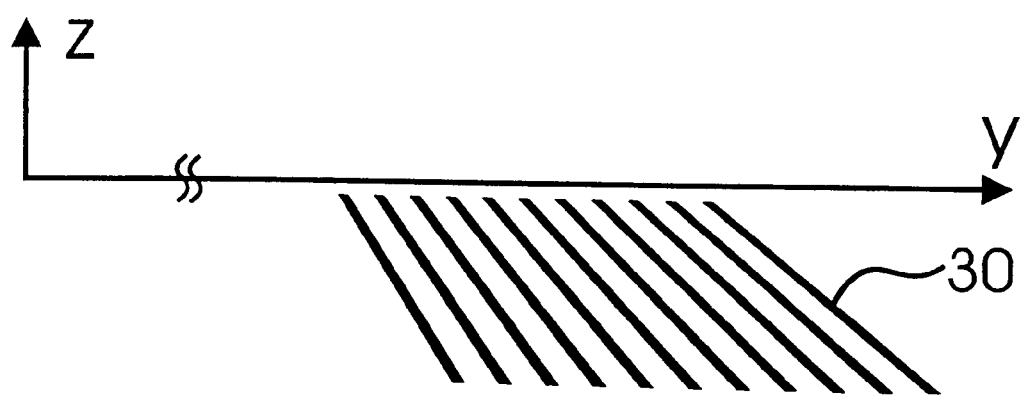

Turning back to the grid illustrated in FIG. 1, an example of a side view of a portion of the focused anti-scatter grid in the x-z plane as taken along lines IXa—IXa in FIG. 1 is set forth in FIG. 9a. As illustrated, this section is taken about the intersection of the x and z axes. Hence, the walls 30 are only slanted by a slight angle. On the other hand, FIG. 9b illustrates a side view of the grid focused in the y-z plane as taken along lines IXb—IXb in FIG. 1. Since the section is further from the intersection of the y and z axes, the angles at which the walls are slanted are larger than those walls closer to the intersection of the y and z axes.

Figure 10:
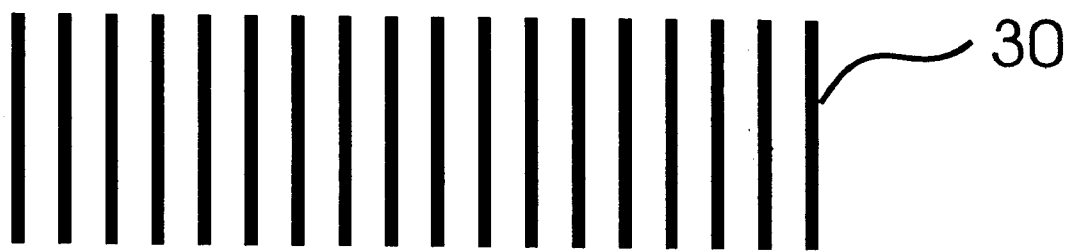
FIG. 10 is a schematic of a side view of an example of a single layer of a section of an unfocused anti-scattered grid made in accordance with a method of the present invention.

For some applications, such as astrophysics, the focal point is sufficiently far away from the holes so that the x-rays are parallel or substantially parallel to each other. For parallel or substantially parallel x-ray sources, the x-ray anti-scatter grid walls should also be parallel or substantially parallel as shown in FIG. 10. This type of grid is called unfocused anti-scatter grid. Some applications are x-ray astronomy and physics applications on synchrotron light sources.

It is noted, of course, that the grid can be focused in the x-z plane but unfocused in the y-z plane and vice versa. That is, if the grid is focused in the x-z plane, the walls are slanted in a manner as shown in FIG. 9a but unlike the walls shown in FIG. 9b, the walls in the y-z plane are parallel or substantially parallel to each other. Likewise, if the grid is focused in the y-z plane, the walls are as shown in FIG. 9b, but unlike those shown in FIG. 9a, the walls in the x-z plane are instead parallel or substantially parallel to each other.

The manner in which tall grids are made in accordance with the present invention will now be discussed.

Figure 11A:
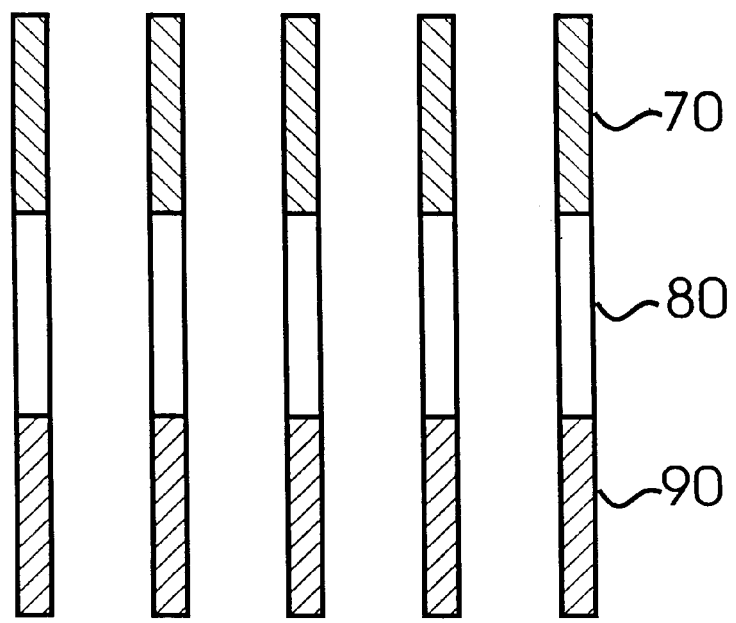
FIGS. 11a and 11b are schematics of a side view of stacks of three layers of unfocused and focused anti-scatter grids, respectively, in accordance with the present invention.
Figure 11B:
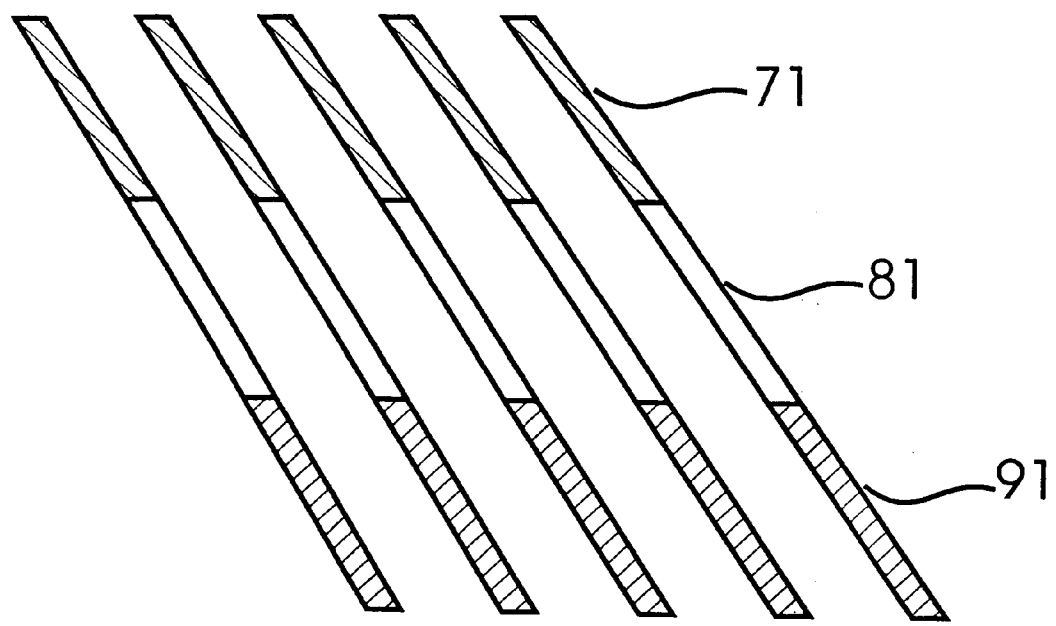

The current electroplating techniques are not capable of making thin walls with desirable device height in one piece. A method of obtaining a usable tall device according to the present invention includes the by stacking of many layers of the grid together using pegs. The pegs can hold the layers together. FIG. 11a is a schematic of a side view of a stack of three layers 70, 80, 90 of an unfocused anti-scatter grid, and FIG. 11b is a schematic of a side view of a stack of these layers 70, 80 and 90 of a focused anti-scatter grid. The layers can be made of the same or similar material or of different materials. Stacking of 10 layers of 210 $\mu$m high grids has been achieved in accordance with the present invention, but as many as 50 or 100 layers or more can be stacked when the grid pieces are all fabricated with correct dimensions.

Again, the materials for each layer or parts of the layer do not have to be identical. In the stacking arrangement shown in FIGS. 11 and 11b, layer 70, 80 and 90 can be made of same material, or of different materials. In the grid shown in FIG. 2, different pieces of the grid can also be made of different materials, if desired.

When the x-ray energy is much higher than 30 keV and the scattered x-rays and background x-rays have wide angular spread, then the grid walls have to be thick. Thick walls reduce the transmission of primary desired radiation. Ideally, high atomic number materials should be used to keep the walls thin so that the ratio of the open area can be kept large without increasing the hole size. Gold (Z=79) is a good x-ray stopping material. However gold is very expensive. If part of the structure can be made of less expensive material, such as nickel, then the cost of the device can be minimized.

Figure 12:
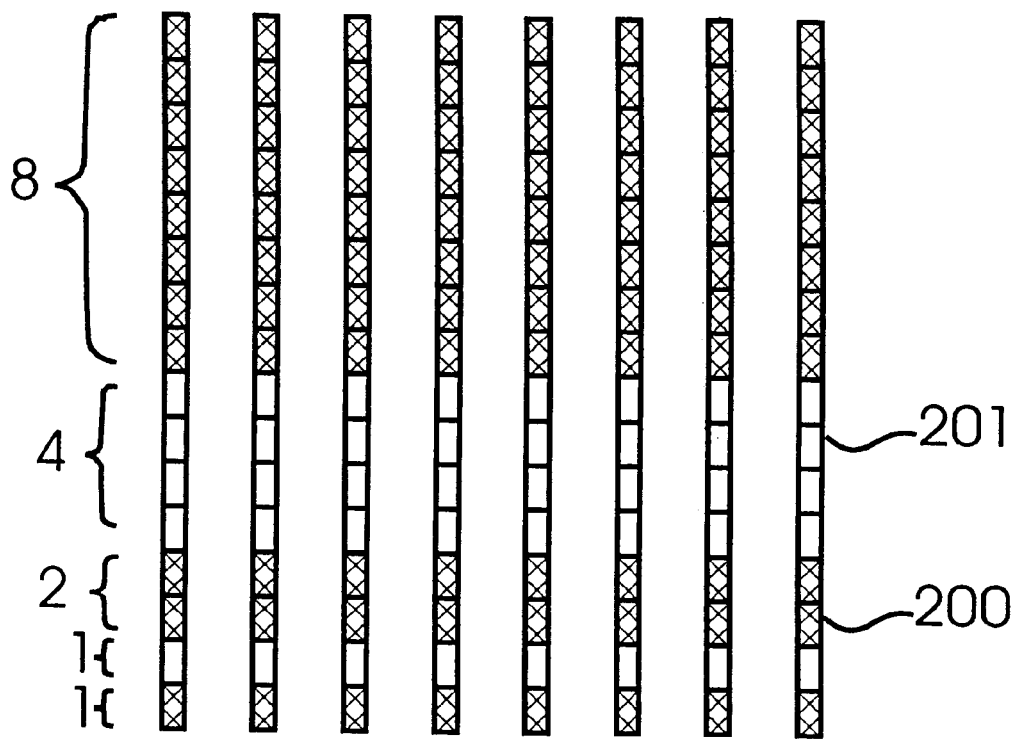
FIG. 12 is a schematic of a side view of a stacking scheme of anti-scattered grids for high energy x-rays and/or smaller acceptance angles in accordance with the present invention.

FIG. 12 is a schematic of a side view of stacking scheme of unfocused anti-scattered grids for high energy electromagnetic energy, such as x-rays. The layers made of higher atomic number material are identified as layers 200 those layers made of lower atomic number material are identified as layers 210. The height H of each layer is the same for exemplary purposes. However, the height H of each layer can be different. The number of layers in each stacked group is shown on the left of FIG. 12. The pattern for the number of layers is

1, $2^0$, $2^1$, $2^2$, $2^3$, . . .

increasing by a factor of two each time. The description of this pattern is as follows:

The lowest layer is 200 followed by

One ($2^0$) layer of 201,

Two ($2^1$) layers of 200,

Four ($2^2$) layer of 201,

Eight ($2^3$) layers of 200,
and more layers if necessary.

Of course, any number of layers can be used. Also, any 201 type layer can be replaced by a 200 type layer without sacrificing reduction of scattered radiation. Assuming that the device is terminated with eight ($2^{n=3}$) layers of 200 on top, the angle of transmitted radiation is $$-1/(2(1+\Sigma 2^n)H) \leq \theta \leq 1/(2(1+\Sigma 2^n)H) \text{ for } n=0 \text{ to } 3.$$

Taking the eight layers of type 200 layer as an example, the height of each layers do not have to be identical as long as the group can be constructed by any number of layers with different heights to give 8H total.

Also, if desired, the holes of one or more layers of the anti-scatter grid can be filled with solid, liquid, glue or any other material required for research or application.

Figure 13:
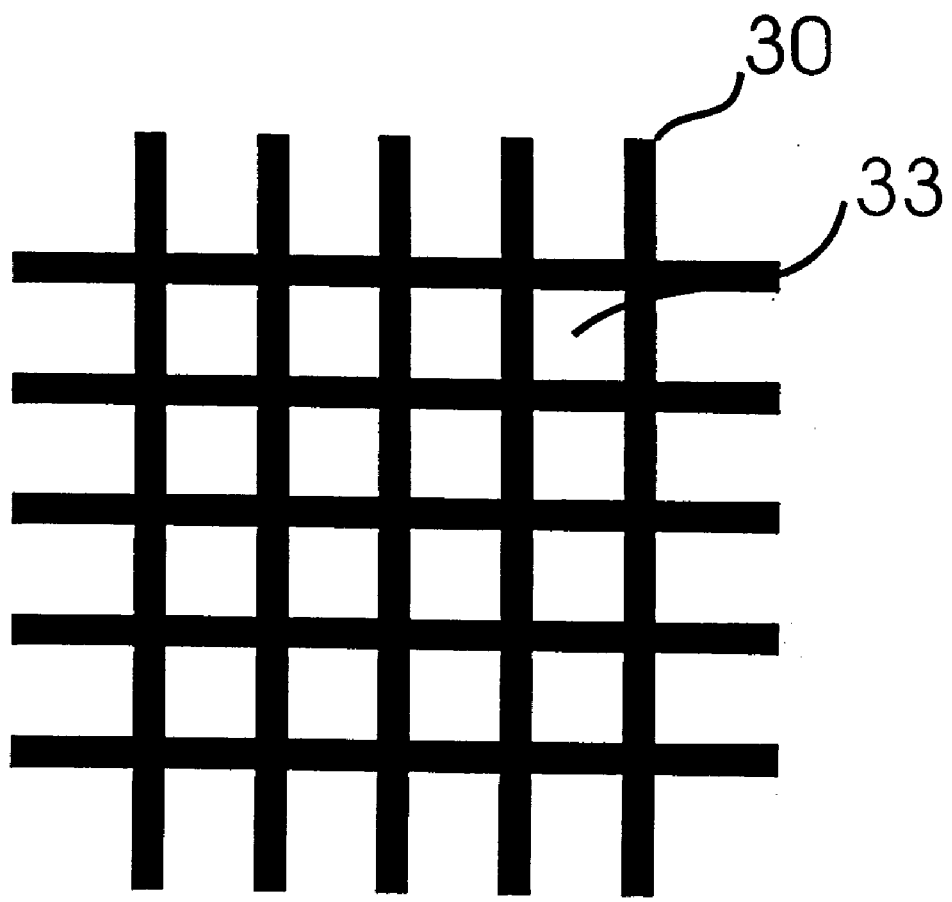
FIG. 13 shows a top view of a layer of the grid filled with x-ray scintalator or phosphor in accordance with the present invention.

Furthermore, if desired, the holes of one or more layers of this anti-scatter grid can be filled by phosphor or any other materials. FIG. 13 shows the top view of a layer of the grid where all the holes are filled with x-ray scintallator or phosphor 33. For some applications, not all the holes need be filled.

Figure 14:
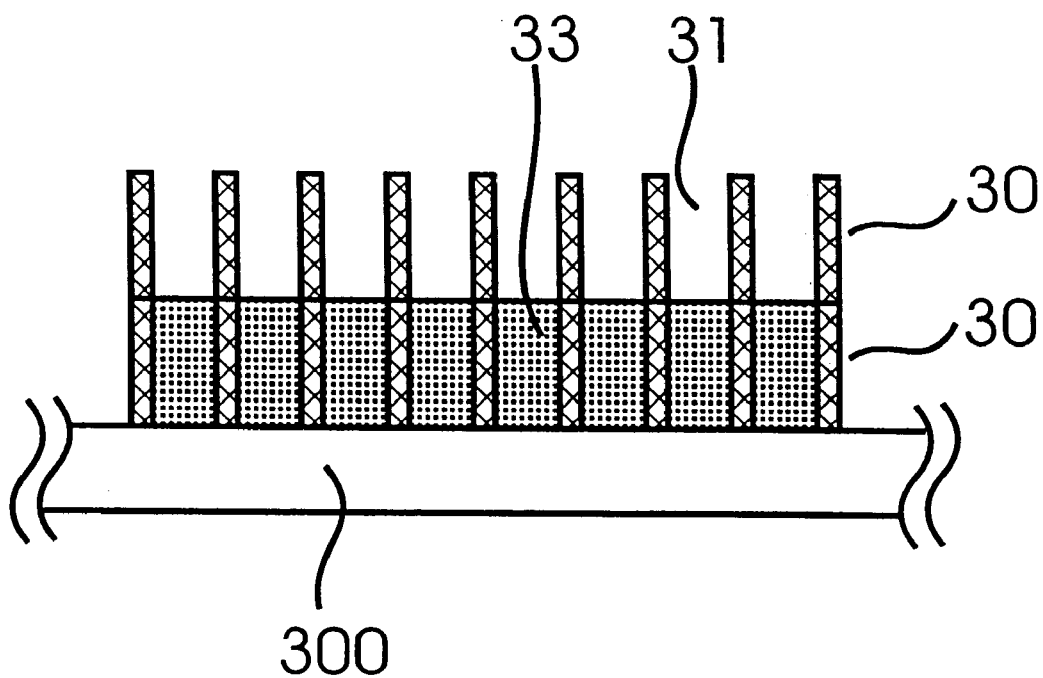
FIG. 14 shows a side view of an anti-scatter/scintallator as shown in FIG. 13 as filled with conventional phosphor.

When the holes are filled with phosphor, the device performs the function of anti-scatter x-ray and x-ray scintallator. The phosphors should only be in the hole of the bottom layer or bottom layers of the grid stack. FIG. 14 shows the side view of two layers of anti-scatter grids setting above a transparent or substantially transparent substrate 300 (e.g., glass) with the phosphor in all the holes of the bottom grid layer 32 and the hole of the layer above 31 are open. The grid, of course, can be a focused grid or an unfocused grid as described above, can be focused in one direction and not in the other, or piecewise focused.

Figure 15:
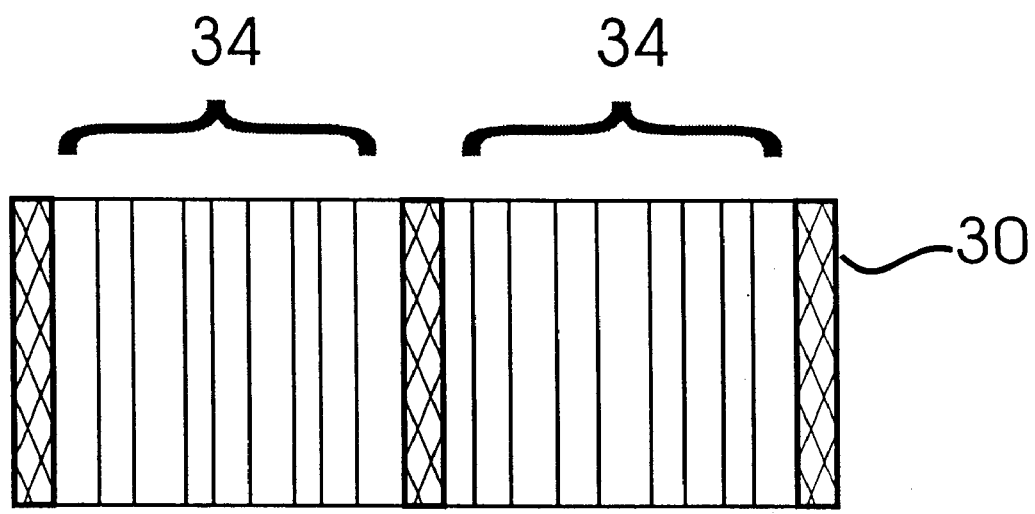
FIG. 15 shows a side view of an anti-scatter/scintallator as shown in FIG. 13 as filled with columnar phosphor.

Some phosphors can channel light. CsI is an x-ray scintillating material that form columnar crystals 34, which act like a light pipe. Other phosphors also have this property. FIG. 15 shows the side view of a layer of anti-scatter/scintallator with columnar phosphor. Also, the grid can be a focused grid or an unfocused grid, focused in one direction and not in the other, or piecewise focused.

A method according to an embodiment of the present invention for forming the pieces of the grid as shown, for example, in FIG. 2 will now be described.

Figure 16A:
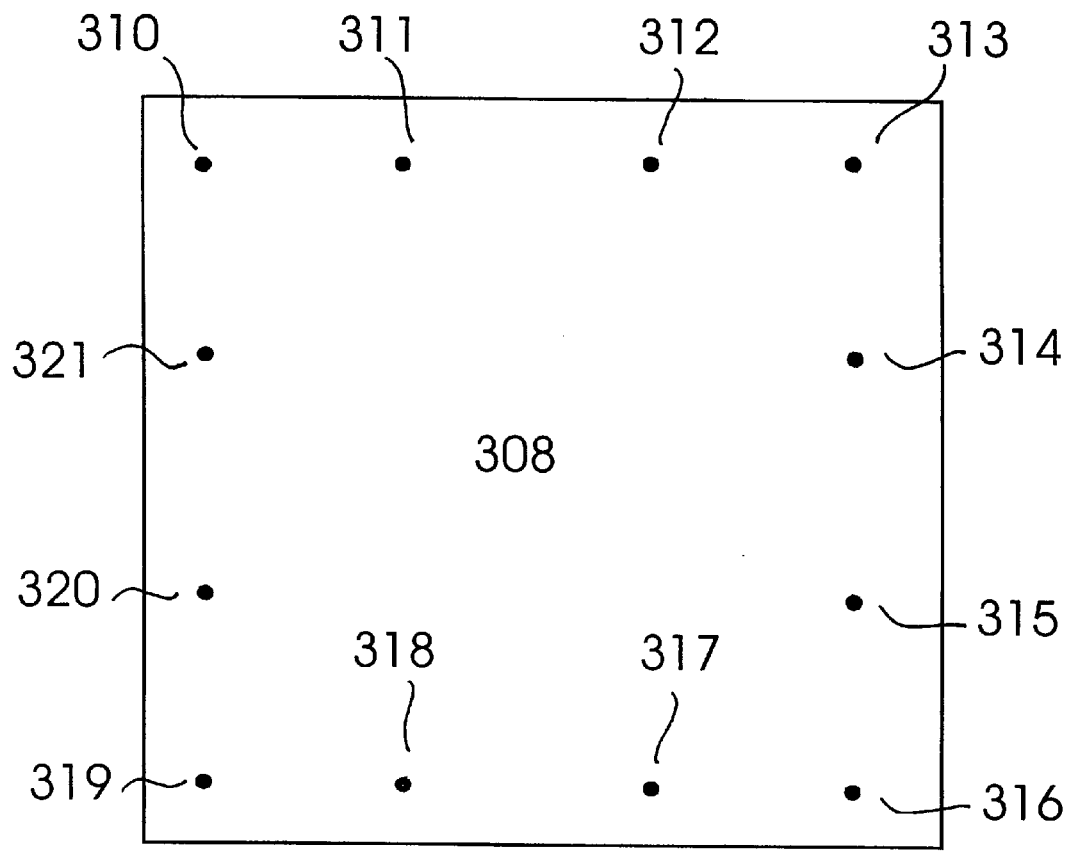
FIGS. 16a and 16b show a top view and side view, respectively, of an example of fixed assembly that is used in the assembly of the anti-scatter grid in accordance with the present invention.
Figure 16B:
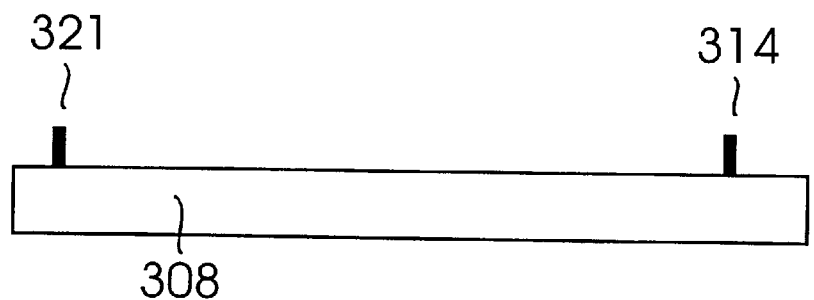

A substrate 308 having a smooth or substantially smooth surface and fixed parts 310–321, which are fabricated by the same method as the grids (as is described below) but not released from the substrate 308, can assist the assembly of the grid pieces. This is demonstrated using the four pieces of grid shown in FIG. 2. FIG. 16*a* shows a top view of substrate 308 having fixed parts 310–321. The fixed parts 310–321 are in the shape of round posts, but, of course, can be any shape. The shape can vary as long as it matches the holes on grid pieces 100, 110, 120 and 130 that it is being used to assemble together. The height of the post is not critical, from few tens of microns to a height not higher than about that of the assembled grid. FIG. 16*b* shows a side view of the substrate 308 illustrating fixed parts 314 and 321, in particular. The substrate 308 can be glass, silicon, ceramic or any other low atomic number appropriate for use in microfabrication.

The edges of the grid pieces 100, 110, 120 and 130 each have a boarder with holes that engages with the fixed parts 310–321 to align and anchor the grid pieces. Since it is often not possible to fabricate fixed pieces as tall as the assembled grid. The layers of the grid have to be held together by pegs. The pegs can be fabricated at the same time as the grid pieces, or separately from the grid pieces.

Of course, it is noted that a substrate 308 having fixed ports 310–321 need not be used in assembling the layers of the grid or stacking the layers of the grid. Also, the substrate 308 can be left to remain on the assembled layer or stacked layers if desired, or remove after stacking and assembly.

Figure 17:
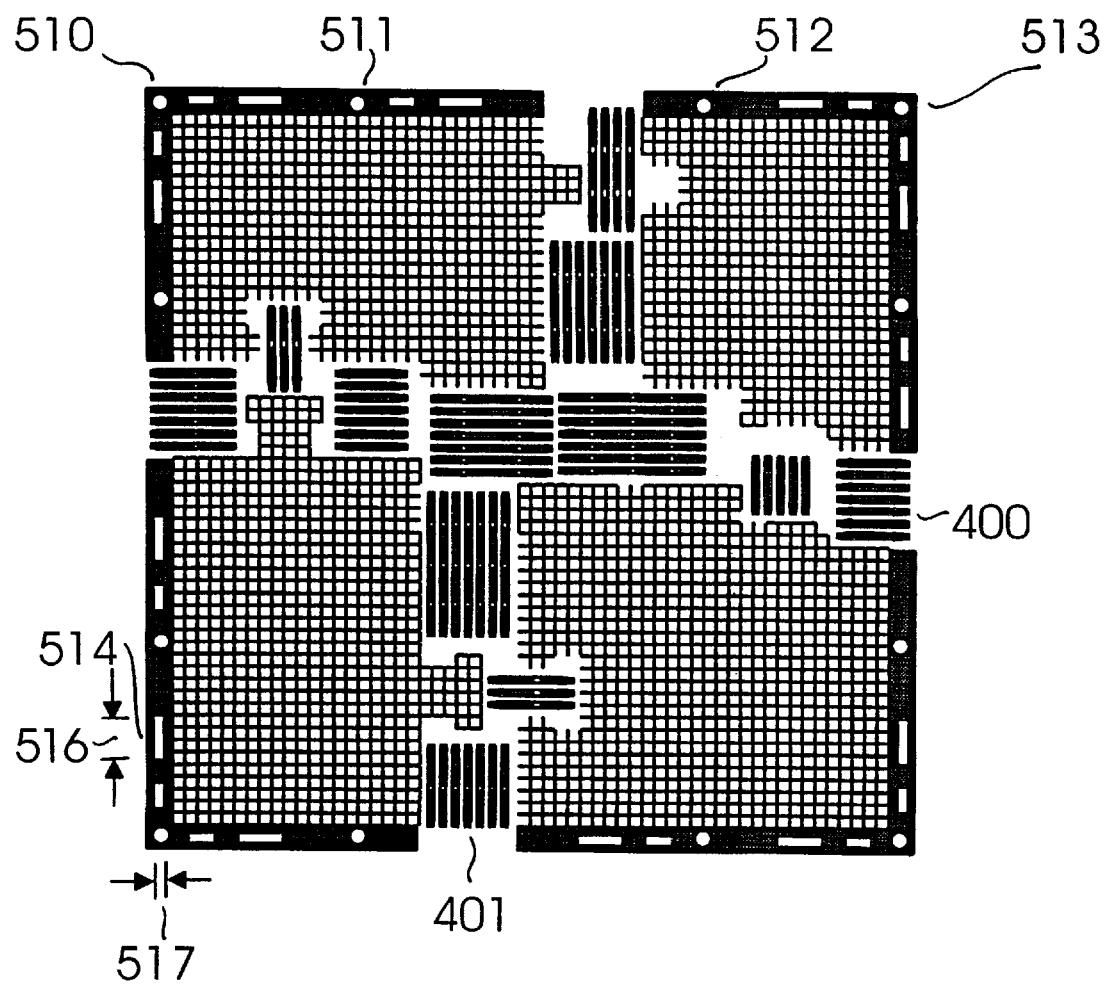
FIG. 17 is an example of a mask layout of the four grid pieces shown in FIG. 2 which further includes a boarder and a variety of pegs.
Figure 18A:
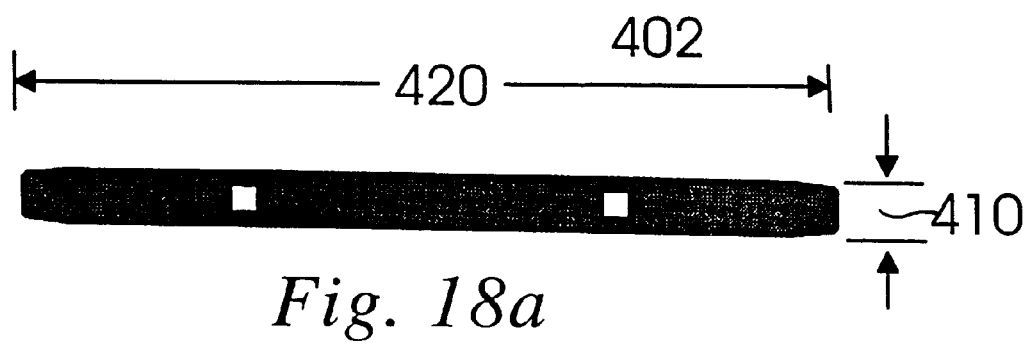
FIGS. 18a and 18b are enlarged views of the examples of mask layouts shown in FIG. 17 for types of pegs in accordance with the present invention pegs.
Figure 18B:
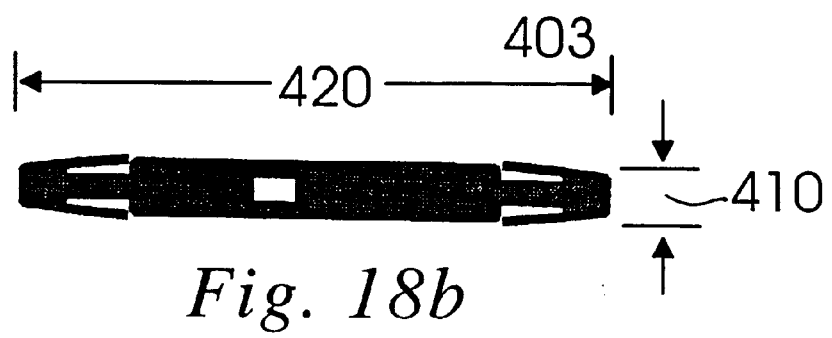

FIG. 17 is a mask layout of the four grid pieces shown in FIG. 2, each of which having a border. It is noted that a variety of pegs (as indicated by mask portions 400 and 401, can be present on the mask layer and thus be formed with the grid pieces. Enlarged views of the mask portion 400 and 401 used in forming the pegs 402 and 403 are shown in FIG. 18*a* and 18*b*, respectively. The width 410 of peg 400 must match or substantially match the one dimension of the hole 514 The thickness of the peg must match or substantially match the other dimension of the hole 514. In this example, the width 410 matches or substantially matches width 517. The height of the peg 420 should be greater than the height of a single layer of the grid H. In this example, the thickness of the peg has to match or substantially match length 516. For the best fit, the peg's dimensions should allow 0.5 $\mu$m or about a 0.5 $\mu$m tolerance on all sides between the walls defining the opening in which the peg is inserted and the outer surface of the peg. When the peg is too small, the grid pieces will move around thus making it difficult to assemble the grid. Otherwise, the shape of the pegs is arbitrary.

Figure 19:
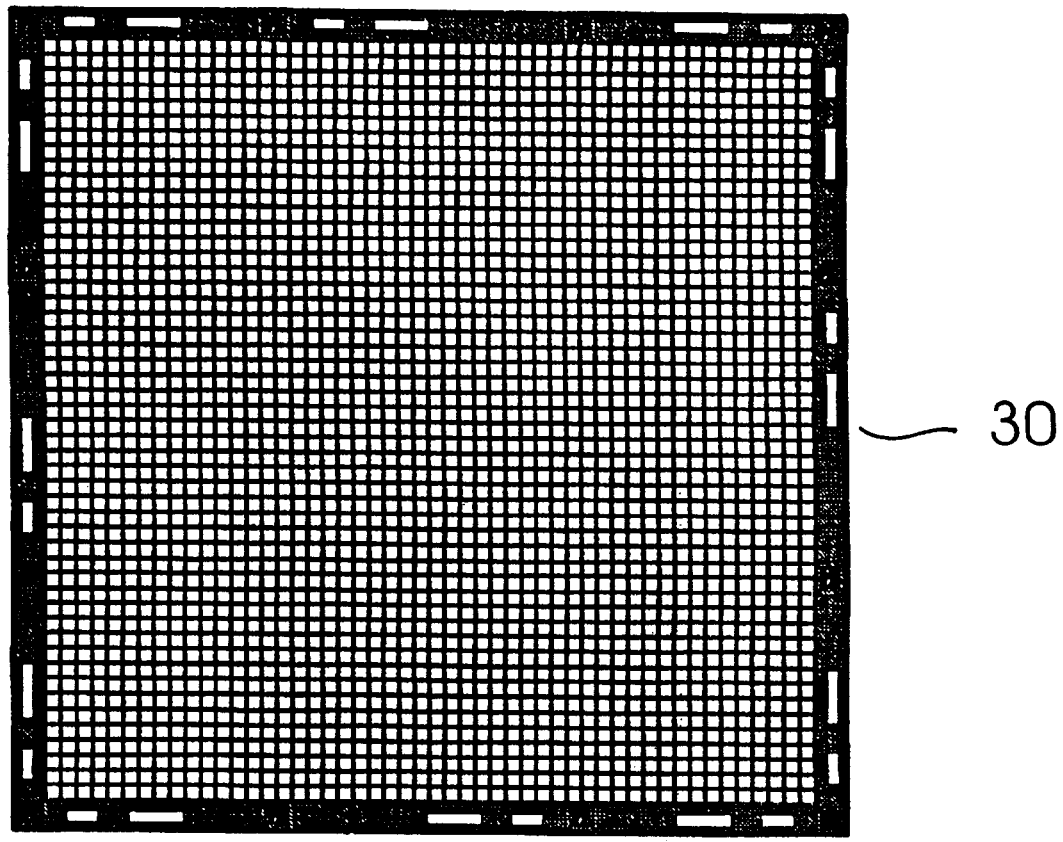
FIG. 19 shows a top view of the pieces of the grid as shown in FIG. 2 assembled as the fixed assembly shown in FIGS. 16a and 16b with the fixed posts.

When the grid is being assembled, the post 310 will go in hole 510, the post 311 will go in hole 511, the post 312 will go in hole 512 and the post 313 will go in hole 513. After the four pieces are assembled on the fixed parts, the grid will look like a single grid 30, a top view of which is shown in FIG. 19. When the number of pieces is small and the interlock is good, then the fixed pieces will not be necessary.

The methods according to the present invention for manufacturing the grids and grid pieces discussed above (as shown, for example, in FIG. 1, 2 and 17) will now be discussed. The first fabrication methods are based on the techniques that developed by Prof. Henry Guckel at University of Wisconsin at Madison called SLIGA.

SLIGA Fabrication Method

The acronym SLIGA stands for surface micromachining and LIGA. SLIGA is primarily advanced by Prof. Henry Guckel of the University of Wisconsin, as described in an article by H. Guckel, K. J. Skrobis, J. Klein, and T. R. Christenson, entitled "Micromechanics via X-Ray Assisted Processing," J. Vac. Sci. Technol. A 12, 2559 (1994), and U.S. Pat. Nos. 5,206,983, 5,190,637, 5,378,583, 5,496,668, and 5,576,147, all to Guckel or Guckel et al., and all of which are incorporated herein by reference. LIGA is a German abbreviation of the three major process steps, lithography, electroplating and molding. LIGA was initially developed at the Karlsruhe Nuclear Research Centre (KfK) in the late 1970s, as described in an article by E. W. Becker, W. Ehrfeld, P. Hagmann, A. Maner and D. Munchmeyer, "Fabrication of Microstructures with high aspect ratios and great structural heights by synchrotron Radiation Lithography, Galvanoforming, and Plastic Molding (LIGA Process)," Microelectron. Eng. 4, 35 (1986).

The processing steps of SLIGA are now described with regard to FIGS. 20*a*–20*e*.

(a) An x-ray mask 730 is designed and made. The regions of the mask transparent or substantially transparent to the x-rays will be regions where the metal 740 will be electroplated. The other parts are masked by a thin layer of gold or any other suitable metal.

(b) A wafer 720 is covered by a thin coating of the appropriate electroplating metal (not shown).

A layer of x-ray resist 720 slightly thicker than the desired grid layer height is attached above the metal layer. In most experiments polymethylmethacrylate (PMMA) is used as the X-ray resist.

Figure 20A:
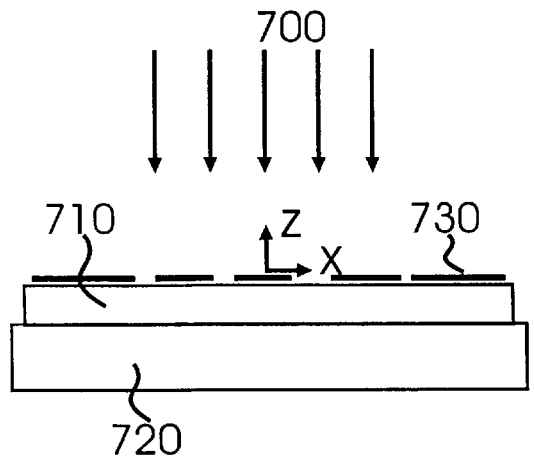
FIGS. 20a, 20b, 20c, 20d and 20e show an example of a method for fabricating a grid in accordance with the present invention which uses a large area parallel x-ray sheet source.
Figure 20B:
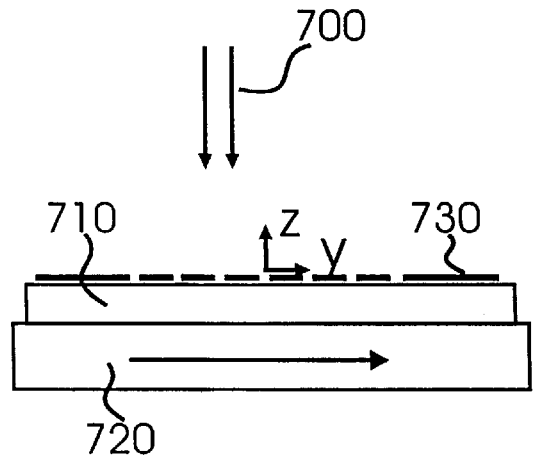
Figure 20C:
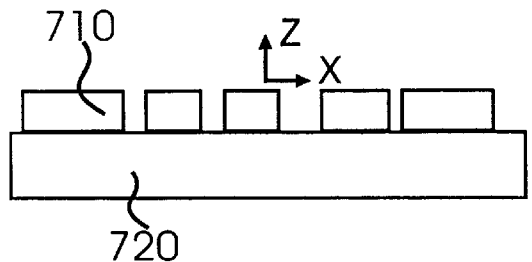

(c) The absorber pattern of an x-ray mask 730 is transferred into a resist by x-ray shadow projection, as shown in FIGS. 20a and 20b. Synchrotron radiation 700 is used because of its very high collimation, high flux and short wavelength. Within the irradiated sections of the resist layer the polymer chains are destroyed, reducing the molecular weight. Of course, any radiation can be used that is sufficient to achieve this effect. During the subsequent development step, the exposed resist is selectively dissolved while the unirradiated parts remain unchanged, as shown in FIG. 20c. The unexposed regions of the resist were covered during irradiation by the gold absorbers of the mask.

Figure 20D:
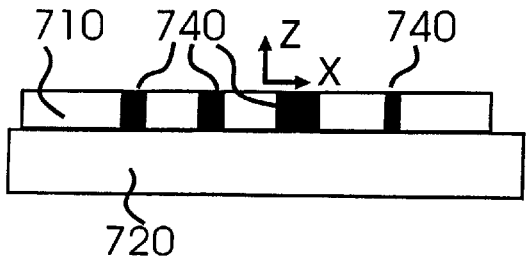

(d) Electroplating is then be used to build up the metal 740 in the exposed pattern region of the non-conducting resist. The common metals are nickel, nickel-iron, copper and gold, but of course, any metal or combination of metals can be used. Metal growth begins on the electrically conducting base plate, as shown in FIG. 20d.

(e) The wafer is polished to the desirable metal thickness with an accuracy of ±1 $\mu$m or thereabout.

Figure 20E:
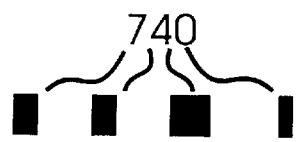

(f) The resist 710 is removed and the metal parts 740 are released from the wafer substrate 720, as shown in FIG. 20e.

For manufacturing, it is not be practical to use a 3 keV x-ray source such as that present at the University of Wisconsin for the following reasons: (i) the x-ray mask for 3 keV x-ray energy is difficult to make, (ii) there is no known method to make a large x-ray mask for 3 keV x-ray energy, (iii) the cost of the x-ray source is high and (iv) there are no simple x-ray optics.

The National Synchrotron Light Source at Brookhaven National Laboratory produces 18.5 keV x-ray. Because of the higher energy x-rays, it is possible to make large masks. Wafer sizes of 15 cm×15 cm are thus possible. A stack of PMMA can be exposed at the same time, as described in an article by H. Guckel, T. R. Christenson, J. Klein, T. Earles, S. Massoud-Ansari, entitled "Micro Electromagnetic Actuators Based on Deep X-Ray Lithography", International Symposium on Microsystems, Intelligent Materials and Robots, Sendai, Japan, Sep. 27–29, 1995. For example, 50 layers of 200 $\mu$m thick PMMA sheets can be stacked and exposed simultaneously. Thus the cost for exposure is only $0.1/cm$^2$ for 10,000 $\mu$m thick stack. The Advanced Photon Source at Argonne National Laboratory is also a very high flux x-ray source. Many other light sources will also be available.

These x-rays light sources are parallel sheet beams. They are best suited for making an unfocused grid, a focused grid in one direction, or a piecewise focused grid. Of course, any other suitable x-ray source can be used.

Figure 21:
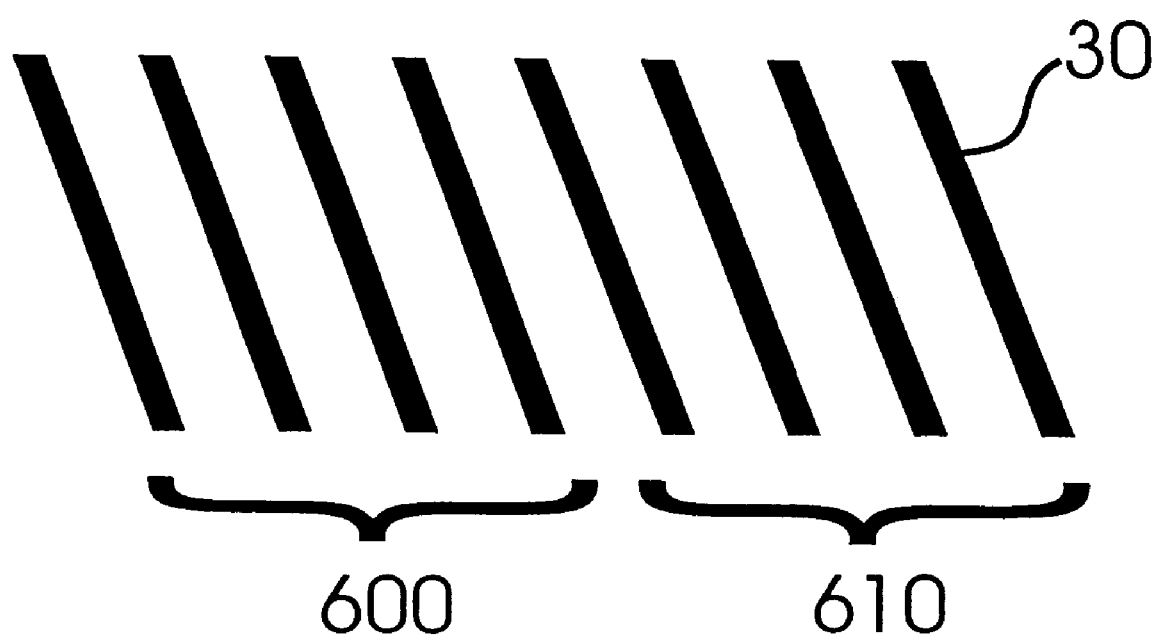
FIG. 21 shows the assembly of two unfocused grid pieces fabricated with parallel x-ray source to form a piecewise focused grid in accordance with the present invention.

The parallel x-ray sheet beam sources cannot make a perfect focused grid. Piecewise unfocused grid assembled together can mimic a focused grid when the pieces are small. In FIG. 21, grid 600 is a unfocused grid with walls slanted at an angle of 20° or about 20° and grid 601 is the neighboring unfocused grid with walls slanted at an angle of 21° or about 21°. When the change in the angle is small, the assembled grid acts as an focused anti-scatter grid. If the pieces are small enough, then the difference between a ideally focused grid and grid assembled by this method can be minimized. Each layer of the grid will require a different mask. All the masks at the same x-y location can be exposed at the same time. The mask and PMMA has to be positioned at the correct angle with respect to the thin sheet x-ray beam 700, as shown in FIGS. 22a and 22b.

A piecewise focused grid can also be assembled from small pieces of grids that are focused in one direction and unfocused in the other direction.

Figure 22A:
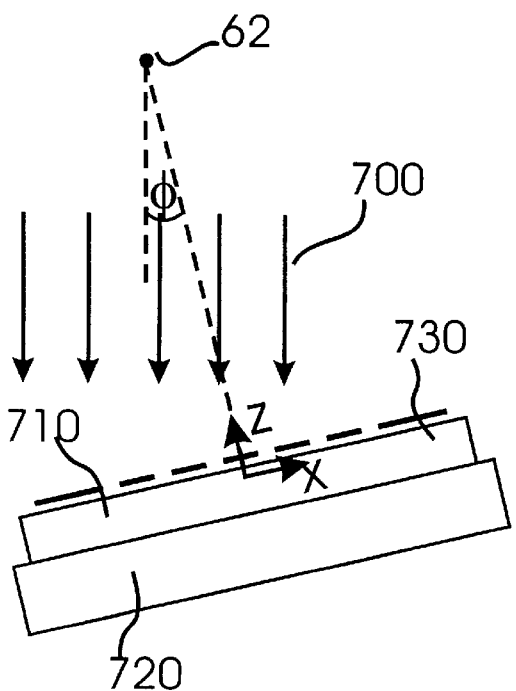
FIGS. 22a and 22b show an example of a PMMA exposure method for forming a focused grid according to the present invention which uses a thin parallel sheet, and an x-ray source which is wide in the x-direction and thin in the y-direction so that the grid formed is unfocused in the x-z plane and is focused in the y-z plane.
Figure 22B:
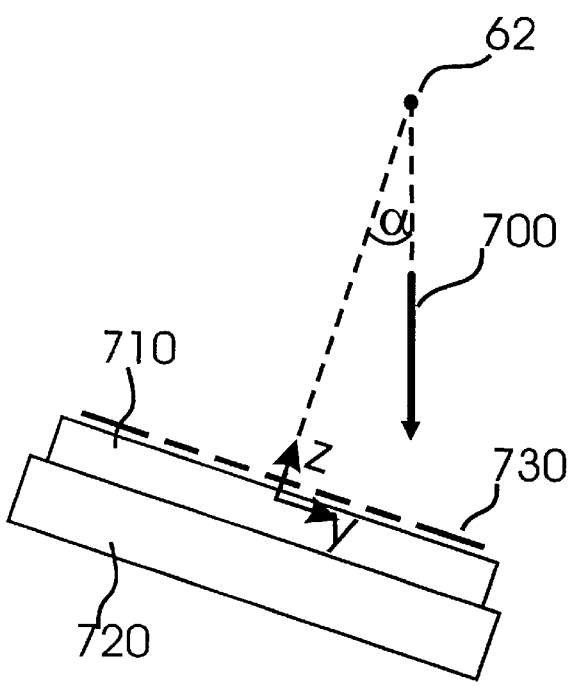

Depending on the location of the mask in the grid that is to be exposed, the mask 730 and the substrate 720 are at an angle $\phi$ relative to the x-rays 700 in the x-z plane as shown in FIG. 22a and at an angle $\alpha$ relative to the x-rays 700 in the y-z plane as shown in FIG. 22b. In the y-z plane, the mask 730 and the substrate 720 will translate in $\chi$ and rotate in $\alpha$ to simulate a focused x-ray source at a fixed imaginary point 62. This method is ideal for making grids focused in one direction or piecewise focused grids. To minimize the gap in a piecewise focused grid produced by parallel x-ray beams in FIG. 22a, the grid piece layout should be thin in the x-direction relative to the y-direction. Rectangular hole openings with the long dimension in the x-direction may be a good design for this x-ray source. After resist exposure, the fabrication steps are the same as shown in FIGS. 20c, 20d and 20e.

Figures 23A, 23B:
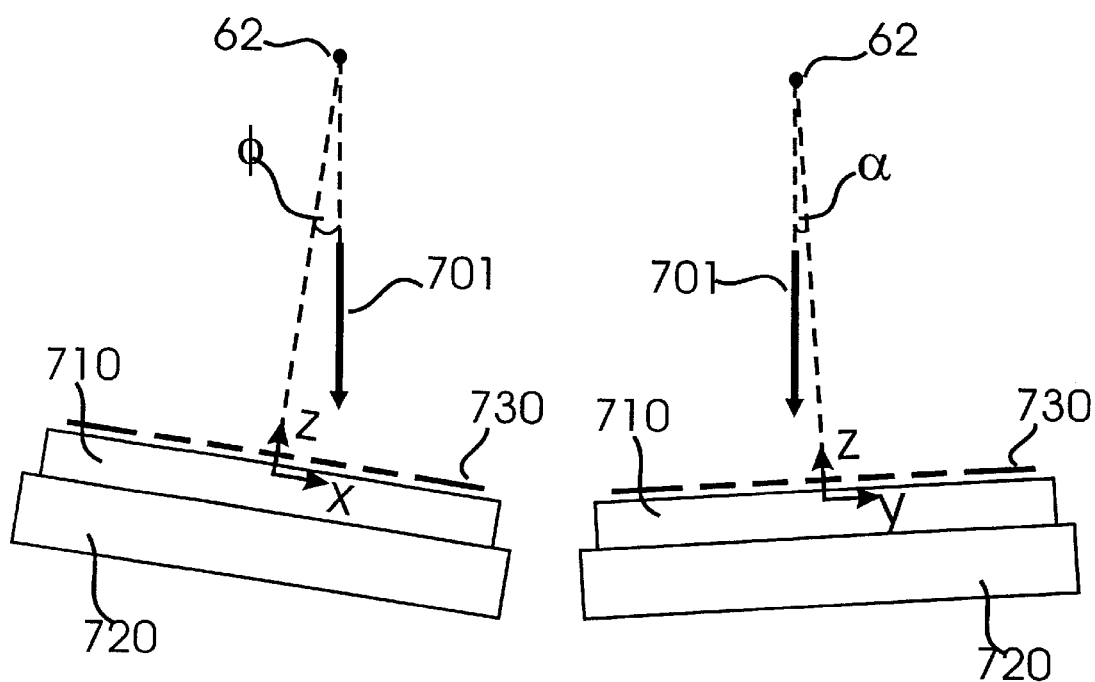
FIGS. 23a and 23b show an example of the PMMA exposure method like that shown in FIGS. 22a and 22b which uses a small parallel x-ray source to produce a focused grid in the x-z plane and in the y-z plane.

Powerful x-rays sources in the form of a thin pencil beam 701, such as free electron lasers, are under development. These sources can be used to expose the mask and PMMA by positioning the mask 730 and the substrate 720 at the correct location and angle with respect to the x-ray source and move it appropriately to simulate a cone shaped x-ray source at a fixed imaginary point 62, as shown in FIG. 23a for the x-z plane and as shown in FIG. 23b for the y-z plane. The exposure times depends on the average flux of the x-ray source. After resist exposure, the fabrication steps are the same as shown in FIGS. 20c, 20d and 20e.

Figure 24:
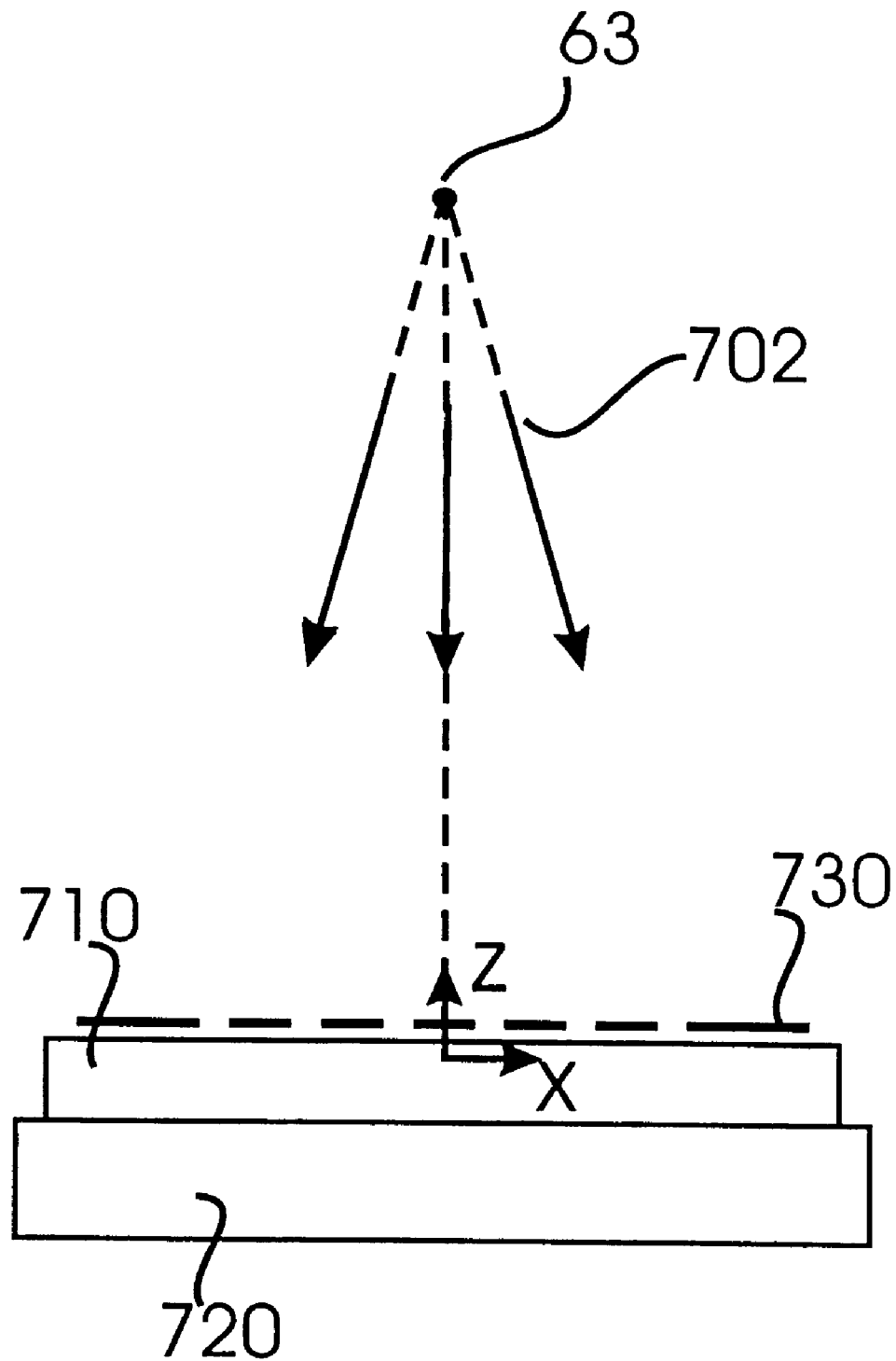
FIG. 24 shows an example of a PMMA exposure method which uses a focused point x-ray source to produce a focused grid in accordance with the present invention.

High flux, laboratory sized, focused point, x-ray source are under development for x-ray lithography. The exposure method is shown in FIG. 24. If the divergence of the x-ray 702 source is not sufficiently large to cover the size of the assembled gird, then the mask 730 and the substrate 720 will have to be moved to expose different parts of the mask. However, no motion is required during the exposure of the individual pieces. After resist exposure, the remaining fabrication steps are the same as shown in FIGS. 20c, 20d and 20e.

Conceptually, the fabrication based on electroplating could also be obtained using near-UV lithography. Ultra-thick resist is becoming available. A single-layer resist 80 $\mu$m to 1200 $\mu$m thick and have successful reproduced exposures at laser wavelength of 400 nm. This resist shows the promise as the foundation of an optical-lithography-based electroplating process. Currently, the vertical pattern fidelity of the UV resist is not as good as x-ray lithography. The critical dimensions that required to be accurate are at the top of each grid layer. Thus, UV lithography will still allow accurate assembly.

Figures 25A, 25B:
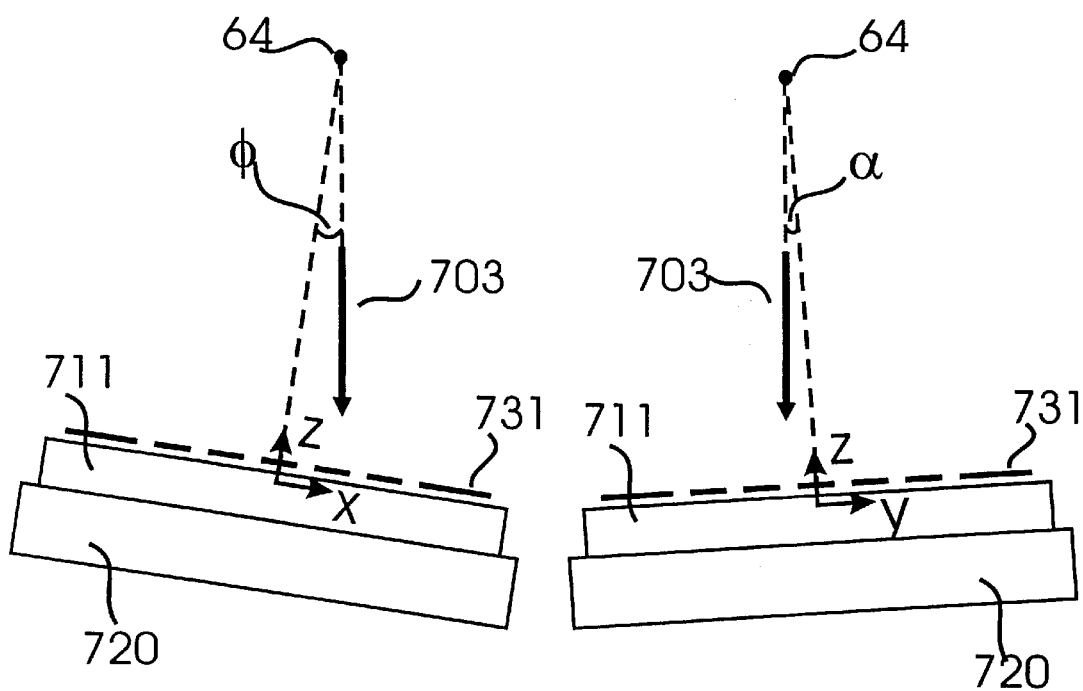
FIGS. 25a and 25b show a fabrication method according to the present invention which uses a small, parallel ultra-violet laser source to produce a focused grid in the x-z plane and in the y-z plane, respectively.

The UV photo resist exposure method to obtain a focused grid is shown in FIGS. 25a and 25b with small, parallel ultraviolet laser source 703. Similar to x-ray exposures shown in FIGS. 23a and 23b, the mask has to be located at the correct position and angle, and the assemble of mask and the photoresist have to be moved during the exposure to simulate the cone shape of the x-ray source located at a fixed imaginary point 64. The resist development will follow the recommended steps specified by the resist supplier. The electroplating method will be the same or similar to that as shown in FIG. 20d.

Figure 26:
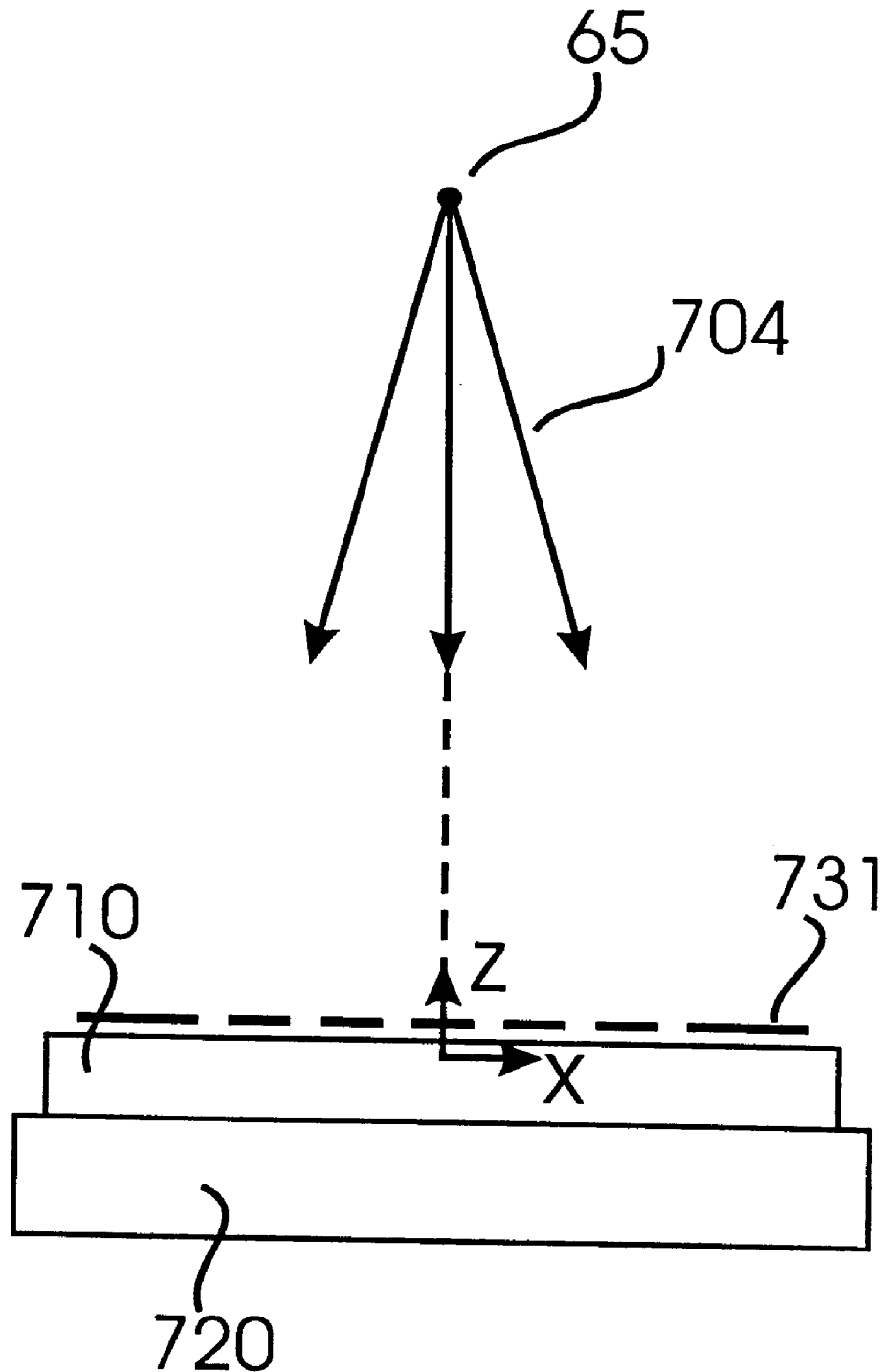
FIG. 26 shows an example of a fabrication method according to the present invention which uses a focused cone beam from an ultraviolet radiation source to produce a focused grid.

The UV photo resist exposure method to obtain a focused grid is shown in FIG. 26 with a focused ultraviolet radiation source located at 65. The mask has to be located at the correct position, but the mask and the photoresist do not have to be moved during the exposure if the UV light 704 divergence angle is sufficiently large to cover the whole grid area. The resist development will follow the recommended steps specified by the resist supplier. The electroplating method will be the same or similar to that as shown in FIG. 20d.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A method for making a grid, comprising at least one layer having a plurality of walls defining openings therein, and being adaptable for use with electromagnetic energy emitting devices, the method comprising the steps of:

applying a resist coating onto a substrate structure;

covering the resist with a mask having a plurality of apertures therein;

irradiating rays of energy onto the mask, such that some of the rays of energy enter at least some of the apertures in the mask at an entering angle other than 0° with respect to a front surface of the mask and strike portions of the resist;

removing the portions of the resist that were irradiated by the rays of energy to create openings in the resist; and introducing material into the openings in the resist such that the material forms the walls of the at least one layer of the grid.

2. A method as claimed in claim 1, wherein the irradiating step comprises the step of positioning the front surface of the mask at a tilted angle other than 0° with respect to a direction of propagation of the rays of energy to cause the rays of energy to enter said at least some of the apertures in the mask at the entering angle.

3. A method as claimed in claim 1, wherein the rays of energy are X-rays, and the resist is an X-ray resist.

4. A method as claimed in claim 1, wherein the rays of energy are UV rays, and the resist is a UV resist.

5. A method as claimed in claim 1, wherein the introducing step comprises the step of electroplating the material into the openings in the resist.

6. A method as claimed in claim 1, wherein the introducing step comprises the step of introducing the material into the openings in the resist such that the material forms portions, at least two of which interlockingly couple together to form at least a portion of a said layer of the grid.

7. A method as claimed in claim 6, further comprising the step of coupling the separate portions of the layer together to form said layer of the grid.

8. A method as claimed in claim 1, further comprising the steps of:

repeating the applying, covering, irradiating, removing and introducing steps to form another said layer of the grid; and stacking the layers of the grid such that walls of the layers are substantially aligned so that the openings in the layers are substantially aligned to form openings which pass entirely through the grid.

9. A method as claimed in claim 7, further comprising the steps of:

repeating the applying, covering, irradiating, removing, introducing and coupling steps to form another said layer of the grid; and stacking the layers of the grid such that walls of the layers are substantially aligned so that the openings in the layers are substantially aligned to form openings which pass entirely through the grid.

10. A method as claimed in claim 1, further comprising the step of filling at least some of the openings in at least some of the layers of the grid with a material which scintillates x-rays passing therethrough.

11. A method as claimed in claim 10, wherein the material filled in the openings in the filling step is one of phosphor or CsI.

12. A method as claimed in claim 7, wherein the coupling step comprises the step of coupling the separate portions of the grid together on a substrate support surface.

13. A method as claimed in claim 7, wherein the coupling step comprises the step of gluing the separate portions together.

14. A method as claimed in claim 8, wherein when the introducing step is being repeated, the material introduced in the openings is different than the material introduced into the openings when first performing the introducing step, and wherein the layers of different materials are stacked on each other during the stacking step.

15. A method for making a grid, comprising at least one layer having a plurality of walls defining openings therein, and being adaptable for use with electromagnetic energy emitting devices, the method comprising the steps of:

applying a resist coating onto a substrate structure;

covering the resist with a mask having a plurality of apertures therein;

irradiating rays of energy onto the mask, such that some of the rays of energy enter the apertures in the mask and strike portions of the resist;

removing the portions of the resist that were irradiated by the rays of energy to create openings in the resist; and introducing material into the openings in the resist such that the material forms portions of the grid, at least two of which interlockingly couple to each other to collectively form at least a portion of the walls of the at least one layer of the grid.

16. A method as claimed in claim 15, wherein the rays of energy are X-rays, and the resist is an X-ray resist.

17. A method as claimed in claim 15, wherein the rays of energy are UV rays, and the resist is a UV resist.

18. A method as claimed in claim 15, wherein the introducing step comprises the step of electroplating the material into the openings in the resist.

19. A method as claimed in claim 15, further comprising the step of coupling the separate portions of the layer together to form the at least one layer of the grid.

20. A method as claimed in claim 19, further comprising the steps of:

repeating the applying, covering, irradiating, removing, introducing and coupling steps to form another said layer of the grid; and stacking the layers of the grid such that walls of the layers are substantially aligned so that the openings in the layers are substantially aligned to form openings which pass entirely through the grid.

21. A method as claimed in claim 15, further comprising the step of filling at least some of the openings in at least some of the layers of the grid with a material which scintillates x-rays passing therethrough.

22. A method as claimed in claim 21, wherein the material filled in the openings in the filling step is one of phosphor or CsI.

23. A method as claimed in claim 19, wherein the coupling step comprises the step of coupling the separate portions of the grid together on a support surface.

24. A method as claimed in claim 19, wherein the coupling step comprises the step of gluing the separate portions together.

25. A method as claimed in claim 20, wherein when the introducing step is being repeated, the material introduced in the openings is different than the material introduced into the openings when first performing the introducing step, and wherein the layers of different materials are stacked on each other during the stacking step.

26. A method as claimed in claim 1, further comprising the step of:
removing the photoresist and the substrate from the material forming the walls of the grid.

27. A grid produced by the method of claim 1.

28. A method as claimed in claim 1, further comprising the step of:
applying at least one metal film onto a substrate to form said substrate structure; and
wherein said resist applying step applies said resist coating onto said metal film of said substrate structure.

29. A method as claimed in claim 8, wherein:
each of said layers of said grid have alignment openings therein; and
the method further comprises the step of inserting alignment pegs into said alignment openings to substantially align said openings in said layers when said layers are stacked in the stacking step.

30. A grid produced by the method of claim 15.

31. A method as claimed in claim 15, further comprising the step of:
applying at least one metal film onto a substrate to form said substrate structure; and
wherein said resist applying step applies said resist coating onto said metal film of said substrate structure.

32. A method as claimed in claim 15, further comprising the step of:
removing the photoresist and the substrate from the material forming the portions of the grid.

33. A method as claimed in claim 20, wherein:
each of said layers of said grid have alignment openings therein; and
the method further comprises the step of inserting alignment pegs into said alignment openings to substantially align said openings in said layers when said layers are stacked in the stacking step.

34. A grid, adaptable for use with electromagnetic energy emitting devices, comprising:
a plurality of solid metal layers, each formed by electroplating and comprising:
top and bottom surfaces; and
a plurality of solid integrated walls, each of which extending from the top to bottom surface and having a plurality of side surfaces, the side surfaces of the solid integrated walls being arranged to define a plurality of openings extending entirely through the layer, and at least some of the walls extending at an angle other than 90° with respect to the top and bottom surfaces such that the directions in which the walls extend all converge at a point in space at a predetermined distance from the front surface of said at least one layer;
wherein each of the plurality of layers are stacked on top of each other such that walls of the layers are substantially aligned so that the openings in the layers are substantially aligned to form openings which pass entirely through the grid; and
each of the plurality of layers comprises a plurality of interlocking sections, each including a portion of the top and bottom surfaces and at least one of said walls, said sections being coupled together to form a said at least one layer.

35. A grid, adaptable for use with electromagnetic energy emitting devices, comprising:
at least one layer comprising a plurality of solid metal sections formed by electroplating, each of the solid metal sections including a top and bottom surface and a plurality of solid integral walls extending from the top to bottom surface and having a plurality of side surfaces, the side surfaces of the solid integral walls being arranged to define a plurality of openings extending entirely through the section, at least two of the plurality of sections being interlockingly coupled together to form at least a portion of said at least one layer such that the top and bottom surfaces of the sections form top and bottom surface, respectively, of said at least one layer, and the walls of the sections form the walls of said at least one layer.

36. A grid as claimed in claim 35, wherein at least some of the walls of each of the sections of the at least one layer extend at substantially 90° with respect to the top and bottom surfaces of their corresponding section such that the directions in which the walls extend are substantially parallel with each other.

37. A grid as claimed in claim 35, wherein at least some of the walls of each of the sections of said at least one layer extend at an angle other than substantially 90° with respect to the top and bottom surfaces of their corresponding section such that the directions in which the walls extend all converge at a point in space at a predetermined distance from the front surface of said at least one layer.

38. A grid as claimed in claim 35, further comprising a plurality of said layers which are stacked on top of each other such that walls of the layers are substantially aligned so that the openings in the layers are substantially aligned to form openings which pass entirely through the grid.

39. A grid as claimed in claim 35, wherein at least some of the openings in at least some of the layers of the grid are filled with a material which scintillates x-rays passing therethrough.

40. A grid as claimed in claim 39, wherein the material filled in the openings is one of phosphor or CsI.

41. A grid as claimed in claim 35, wherein the separate sections of the grid are coupled together on a support surface.

42. A grid as claimed in claim 35, wherein the separate sections or the grid are glued together.

43. A grid as claimed in claim 38, wherein some of the layers are made of a material different than the material of which other of the layers are made, and wherein the layers of different materials are stacked on each other.

44. A grid as claimed in claim 43, wherein:
each of said layers of said grid have alignment openings therein; and
the grid further comprises alignment pegs which are inserted into said alignment openings to substantially align said openings in said layers when said layers are stacked.

45. A grid, adaptable for use with electromagnetic energy emitting devices, comprising:
at least one solid metal layer, formed by electroplating, comprising:

top and bottom surfaces; and a plurality of solid integrated walls, each of which extending from the top to bottom surface and having a plurality of side surfaces, the side surfaces of the solid integrated walls being arranged to define a plurality of openings extending entirely through the layer, and at least some of the walls extending at an angle other than 90° with respect to the top and bottom surfaces such that the directions in which the walls extend all converge at a point in space at a predetermined distance from the front surface of said at least one layer; and wherein at least some of the openings in at least some of the layers of the grid are filled with a material which scintillates x-rays passing therethrough.

46. A grid as claimed in claim 45, wherein the material filled in the openings is one of phosphor or CsI.

47. A grid, adaptable for use with electromagnetic energy emitting devices, comprising:

a plurality of solid metal layers, each formed by electroplating and comprising:

top and bottom surfaces; and a plurality of solid integrated walls, each of which extending from the top to bottom surface and having a plurality of side surfaces, the side surfaces of the solid integrated walls being arranged to define a plurality of openings extending entirely through the layer, and at least some of the walls extending at an angle other than 90° with respect to the top and bottom surfaces such that the directions in which the walls extend all converge at a point in space at a predetermined distance from the front surface of said at least one layer;

wherein each of the plurality of layers are stacked on top of each other such that walls of the layers are substantially aligned so that the openings in the layers are substantially aligned to form openings which pass entirely through the grid; and some of the layers are made of material different from the material of which other of the layers are made, and wherein the layers of different materials are stacked on each other.

48. A grid as claimed in claim 47, wherein:

each of said layers of said grid have alignment openings therein; and the grid further comprises alignment pegs which are inserted into said alignment openings to substantially align said openings in said layers when said layers are stacked.

\* \* \* \* \*